United States Patent
Okuda et al.

(10) Patent No.: US 11,184,984 B2
(45) Date of Patent: Nov. 23, 2021

(54) SOLDER PRINTING INSPECTION DEVICE, SOLDER PRINTING INSPECTION METHOD AND METHOD OF MANUFACTURING SUBSTRATE

(71) Applicant: CKD Corporation, Aichi (JP)

(72) Inventors: Manabu Okuda, Aichi (JP); Tsuyoshi Ohyama, Aichi (JP); Norihiko Sakaida, Aichi (JP)

(73) Assignee: CKD CORPORATION, Aichi (JP)

( * ) Notice: Subject to any disclaimer, the term of this patent is extended or adjusted under 35 U.S.C. 154(b) by 307 days.

(21) Appl. No.: 16/527,947

(22) Filed: Jul. 31, 2019

(65) Prior Publication Data
US 2019/0357361 A1 Nov. 21, 2019

Related U.S. Application Data

(63) Continuation of application No. PCT/JP2017/030143, filed on Aug. 23, 2017.

(30) Foreign Application Priority Data

Feb. 9, 2017 (JP) .............................. JP2017-021780

(51) Int. Cl.
*H05K 3/00* (2006.01)
*B23K 1/00* (2006.01)
(Continued)

(52) U.S. Cl.
CPC ............. *H05K 3/341* (2013.01); *B23K 1/005* (2013.01); *B23K 1/0016* (2013.01); *G01B 11/24* (2013.01);
(Continued)

(58) Field of Classification Search
CPC ....... G01B 11/24; G01B 11/00; G01B 11/254; G01B 2210/56; G01B 11/002;
(Continued)

(56) References Cited

U.S. PATENT DOCUMENTS 10,267,626 B2 * 4/2019 Morimoto .......... G01B 11/2513
10,401,145 B2 * 9/2019 Hoeller ................ G01B 21/042
(Continued)

FOREIGN PATENT DOCUMENTS

JP       H8130363 A     5/1996
JP       2002271096 A   9/2002
(Continued)

OTHER PUBLICATIONS

International Search Report issued in corresponding International Application No. PCT/JP2017/030143, dated Oct. 31, 2017, with translation (4 pages).
(Continued)

*Primary Examiner* — Erin B Saad
(74) *Attorney, Agent, or Firm* — Osha Bergman Watanabe & Burton LLP

(57) ABSTRACT

A solder printing inspection device that is placed on an upstream side of a component mounting machine that mounts an electronic component on solder that is printed on a substrate by a solder printing machine, and that inspects the solder on the substrate on which a thermosetting adhesive is applied, the solder printing inspection device including: an irradiator that irradiates the solder with light; an imaging device that takes an image of the irradiated solder; a processor that: generates actual solder position information of a solder group that the electronic component is mounted on based on the image, wherein the solder group includes two or more solders; generates, based on design data or manufacturing data, ideal solder inspection reference information indicating a reference inspection position and/or a reference inspection range of the solder included in the solder group; outputs mounting position adjustment information to the component mounting machine.

10 Claims, 13 Drawing Sheets

(51) Int. Cl.
*B23K 3/00* (2006.01)
*H05K 3/34* (2006.01)
*G06T 7/70* (2017.01)
*B23K 1/005* (2006.01)
*G01B 11/24* (2006.01)
*G06T 7/00* (2017.01)
*B23K 101/42* (2006.01)

(52) U.S. Cl.
CPC ............ *G06T 7/001* (2013.01); *G06T 7/0006* (2013.01); *G06T 7/70* (2017.01); *B23K 2101/42* (2018.08); *G06T 2207/30141* (2013.01); *G06T 2207/30152* (2013.01); *H05K 2203/048* (2013.01); *H05K 2203/166* (2013.01)

(58) Field of Classification Search
CPC .. G01B 11/02; G01B 11/2522; G01N 21/956; G01N 2021/95646; G01N 2021/845; G01N 21/3563; G01N 21/359; G01N 21/9508; B23K 1/0016; B23K 1/008; B23K 2101/40; B23K 37/04; B23K 3/08
See application file for complete search history.

(56) References Cited

U.S. PATENT DOCUMENTS

| | | | |
|---|---|---|---|
| 10,484,614 B2* | 11/2019 | Kim | H04N 5/2256 |
| 10,551,177 B2* | 2/2020 | Morimoto | G01B 11/165 |
| 10,739,580 B2* | 8/2020 | Homma | G01N 21/95 |
| 2007/0205253 A1* | 9/2007 | Hubner | H01L 24/17 228/193 |
| 2015/0231744 A1* | 8/2015 | Okuda | B23K 37/04 356/244 |
| 2017/0248413 A1* | 8/2017 | Ohyama | G01B 11/2513 |
| 2017/0289416 A1* | 10/2017 | Umemura | G06T 7/0004 |
| 2018/0112974 A1* | 4/2018 | Ohyama | G06T 7/001 |
| 2018/0162618 A1* | 6/2018 | Maruyama | B65B 9/04 |
| 2018/0313645 A1* | 11/2018 | Umemura | G01B 11/2527 |
| 2019/0025048 A1* | 1/2019 | Ohyama | G01B 11/24 |
| 2019/0357361 A1* | 11/2019 | Okuda | H05K 3/3431 |
| 2019/0360798 A1* | 11/2019 | Umemura | G01N 21/956 |
| 2019/0364707 A1* | 11/2019 | Futamura | H05K 3/3494 |
| 2020/0031511 A1* | 1/2020 | Taguchi | B65B 57/10 |
| 2021/0047066 A1* | 2/2021 | Taguchi | G01N 21/3563 |

FOREIGN PATENT DOCUMENTS

| | | |
|---|---|---|
| JP | 2007268613 A | 10/2007 |
| JP | 2009192282 A | 8/2009 |
| JP | 2015119134 A | 6/2015 |

OTHER PUBLICATIONS

Notice of Reasons for Refusal issued in corresponding Japanese Patent Application No. 2017-021780, dated Jan. 16, 2018, with translation (4 pages).

* cited by examiner

SOLDER PRINTING INSPECTION DEVICE, SOLDER PRINTING INSPECTION METHOD AND METHOD OF MANUFACTURING SUBSTRATE

BACKGROUND

Technical Field

The present invention relates to a solder printing inspection device configured to inspect a substrate, such as a printed circuit board or the like, as well as a solder printing inspection method and a method of manufacturing the substrate.

Description of Related Art

A general procedure of mounting electronic components on a printed circuit board first prints solder paste on electrode patterns laid on the printed circuit board. The procedure then temporarily sticks the electronic components on the printed circuit board with the solder paste printed thereon by taking into account the viscosity of the solder paste. A thermosetting adhesive may be applied on the printed circuit board, with a view to preventing the electronic components from dropping off, for example, when the printed circuit board with the electronic components mounted thereon passes through a predetermined reflow furnace. After mounting of the electronic components, the printed circuit board is led to the reflow furnace to be subjected to a predetermined reflow process for soldering and curing the adhesive. In general, each electronic component has a plurality of electrode portions (electrodes and leads). The respective electrode portions are joined with different pieces of the solder paste. One electronic component is accordingly mounted on each solder group comprised of multiple pieces of solder paste.

Inspection with regard to the printing quality of solder paste is performed in a stage prior to the reflow process. A proposed inspection device for performing such inspection takes into account exertion of self-alignment effect in the reflow process. The self-alignment effect is achieved by the function that causes the solder paste molten in the reflow process to wet and spread along the surface of the electrode pattern. A proposed configuration of this type of inspection device offsets a reference position of inspection by a predetermined amount in the unit of each electronic component (in the unit of each solder group) relative to the positions of actually printed solder paste and inspects the printing quality of each piece of the solder paste based on this offset reference position (as described in, for example, Patent Literature 1).

Patent Literature

Patent Literature 1: JP 2009-192282A

The self-alignment effect may, however, be not sufficiently exerted, depending on the curing temperature of the adhesive. In such cases, when the printing quality of solder paste is inspected based on the offset reference position, this is likely to cause a failure in appropriately determining the printing quality of solder paste.

SUMMARY

One or more embodiments of the present invention provide a solder printing inspection device that is configured to appropriately determine the printing quality of solders on a substrate with an adhesive applied thereon, as well as provide a solder inspection method and a method of manufacturing the substrate.

The following describes embodiments of the present invention. Functions and advantageous effects that are characteristic of one or more embodiments are also described as appropriate.

Aspect 1. According to one or more embodiments, there is provided a solder printing inspection device placed on an upstream side of a component mounting machine, which is used to mount an electronic component on solder printed on a substrate by a solder printing machine, and configured to inspect the solder on the substrate with a thermosetting adhesive applied thereon. The solder printing inspection device comprises an irradiation unit configured to irradiate at least the solder with light; an imaging unit configured to take an image of at least the solder irradiated with the light; an actual solder position information generating unit configured to generate actual solder position information that is position information of a solder group, which includes two or more solders and which the electronic component is mounted on, based on image data taken by the imaging unit; an ideal solder inspection reference information generating unit configured to generate ideal solder inspection reference information, which indicates a reference inspection position and/or a reference inspection range of the solder included in the solder group, based on design data or manufacturing data; a mounting position adjustment information output unit configured to output mounting position adjustment information to the component mounting machine, wherein the mounting position adjustment information is information that indicates an amount of positional misalignment and a direction of positional misalignment of expected mounting position information indicating an expected mounting position of the electronic component, relative to ideal mounting position information indicating an ideal mounting position of the electronic component and that is based on an amount of positional misalignment and a direction of positional misalignment of the actual solder position information relative to ideal solder position information indicating a position of the solder group on the design data or on the manufacturing data; and an adhesive information obtaining unit configured to obtain information with regard to a curing temperature of the adhesive.

When the curing temperature of the adhesive, which is used to fix the electronic component corresponding to the solder group that is a predetermined inspection object, obtained by the adhesive information obtaining unit is higher than a melting temperature of each of the solders included in the solder group, inspection of each of the solders included in the solder group is performed, based on actual inspection reference information obtained by shifting the ideal solder inspection reference information by the mounting position adjustment information with regard to the solder group, and the mounting position adjustment information is output to the component mounting machine by the mounting position adjustment information output unit.

When the curing temperature of the adhesive, which is used to fix the electronic component corresponding to the solder group that is the inspection object, obtained by the adhesive information obtaining unit is lower than the melting temperature of each of the solders included in the solder group, inspection of each of the solders included in the solder group is performed, based on the ideal solder inspection reference information with regard to the solder group.

The "(actual or ideal) solder position information" shows a relative position of a solder group to a substrate and may be, for example, the center or the center of gravity of a region (=solder region) occupied by each of the solders included in the solder group on the substrate, the center or the center of gravity of a rectangle circumscribing the solder region, or a midpoint or the center of gravity of the respective solder regions (for example, a midpoint or the center of gravity of the centers or the centers of gravity of the respective solder regions).

The "ideal mounting position information" shows an ideal mounting position of an electronic component, which is generated based on, for example, solder positions on the data. This information may be, for example, ideal solder position information itself or the midpoint or the center of gravity of the respective solder regions.

The "expected mounting position information" shows an expected mounting position of an electronic component, which is generated based on actually printed solders. This information may be, for example, actual solder position information itself or the midpoint or the center of gravity of the respective solder regions.

The "ideal solder inspection reference information" shows an inspection position or an inspection range of each solder on the data. This information may be, for example, ideal solder position information, an inspection window (ideal solder inspection window) generated based on a region on the data occupied by the solder (ideal solder region), or the center or the center of gravity of the solder region on the data.

The "mounting position adjustment information" is information indicating the degrees of an amount of positional misalignment and a direction of positional misalignment with regard to an actually printed solder group relative to a solder group on the data and may be expressed by, for example, vector information or rotation angle information.

The "actual inspection reference information" is information indicating an inspection reference position and an inspection reference range of each actually printed solder. This information may be, for example, information obtained by shifting the ideal solder inspection reference information (e.g., coordinate information or an inspection window) by a predetermined vector component or may be information obtained by rotating the ideal solder inspection reference information (e.g., coordinate information or an inspection window) by a predetermined rotation angle.

When the curing temperature of the adhesive, which is used to fix an electronic component corresponding to a solder group that is an inspection object, obtained by the adhesive information obtaining unit is higher than the melting temperature of the solders included in the solder group, i.e., under the condition that self-alignment effect is likely to be exerted, the configuration of the above aspect 1 performs inspection of each of the solders included in the solder group on the basis of the actual inspection reference information that is obtained by shifting the ideal solder inspection reference information by the mounting position adjustment information. In other words, under the condition that the self-alignment effect is likely to be exerted, the configuration of the aspect 1 changes a reference position of inspection in the unit of each electronic component (in the unit of each solder group), based on the positions of actually printed solders, and performs inspection of each of the solders, based on this changed reference position. Accordingly, for example, when the respective solders included in the solder group have relatively large amounts of positional misalignment but the amounts of positional misalignment and the directions of positional misalignment are approximately fixed and it is expected to place the solders and the like at appropriate positions by the self-alignment effect, this may make a determination of "good printing quality". In another example, when the individual solders have relatively small amounts of positional misalignment but the individual solders have varying directions of positional misalignment and it is unlikely to mount an electronic component appropriately, on the other hand, this may result in significantly deviating a certain solder from the reference position of inspection and may thus make a determination of "poor printing quality". This configuration accordingly enables the printing quality of the solders to be appropriately inspected by taking into account exertion of the self-alignment effect.

When the curing temperature of the adhesive, which is used to fix the electronic component corresponding to the solder group that is the inspection object, obtained by the adhesive information obtaining unit is lower than the melting temperature of the solders included in the solder group, on the other hand, the configuration of the above aspect 1 performs inspection of each of the solders included in the solder group on the basis of the ideal solder inspection reference information. In other words, under the condition that the self-alignment effect is not exerted or is unlikely to be exerted, the configuration of the above aspect 1 performs inspection of each of the solders, based on the positions and the regions of the respective solders on design data or on manufacturing data (ideal positions and ideal regions of the respective solders on an eventually produced substrate). This configuration accordingly enables the printing quality of the solders to be appropriately inspected by taking into account non-exertion or improbable exertion of the self-alignment effect.

As described above, the configuration of the above aspect 1 enables the printing quality of the solders to be appropriately inspected both in the case where the self-alignment effect is exerted and in the case where the self-alignment effect is not exerted (or is unlikely to be exerted). As a result, this configuration prevents the electronic components from being mounted on the substrate where the solders are not appropriately printed, thus enhancing the yield and suppressing an increase in the manufacturing cost.

Furthermore, when the curing temperature of the adhesive is higher than the melting temperature of the solder, the configuration of the above aspect 1 outputs the mounting position adjustment information, which is information based on the amount of positional misalignment and the direction of positional misalignment of the actual solder position information relative to the ideal solder position information, to the component mounting machine. This configuration accordingly enables an electronic component to be placed at a position determined by taking into account the self-alignment effect and more reliably mounts the electronic component at an appropriate position. This configuration utilizes the information that is generated in an inspection process, for a mounting process. There is accordingly no need to perform a series of processing, which is similar to that performed in the inspection process, in a duplicated manner in the mounting process. This improves the manufacturing efficiency.

Aspect 2. According to one or more embodiments, there is provided a solder printing inspection device placed on an upstream side of a component mounting machine, which is used to mount an electronic component on solder printed on a substrate by a solder printing machine, and configured to inspect the solder on the substrate with a thermosetting adhesive applied thereon. The solder printing inspection device comprises an irradiation unit configured to irradiate at least the solder with light; an imaging unit configured to take an image of at least the solder irradiated with the light; an actual solder position information generating unit configured to generate actual solder position information that is position information of a solder group, which includes two or more solders and which the electronic component is mounted on, based on image data taken by the imaging unit; an ideal solder inspection reference information generating unit configured to generate ideal solder inspection reference information, which indicates a reference inspection position and/or a reference inspection range of the solder included in the solder group, based on design data or manufacturing data; a mounting position adjustment information output unit configured to output mounting position adjustment information to the component mounting machine, wherein the mounting position adjustment information is information that indicates an amount of positional misalignment and a direction of positional misalignment of expected mounting position information indicating an expected mounting position of the electronic component, relative to ideal mounting position information indicating an ideal mounting position of the electronic component and that is based on an amount of positional misalignment and a direction of positional misalignment of the actual solder position information relative to ideal solder position information indicating a position of the solder group on the design data or on the manufacturing data; and an adhesive information obtaining unit configured to obtain information with regard to a curing temperature of the adhesive.

When the curing temperature of the adhesive, which is used to fix the electronic component corresponding to the solder group that is a predetermined inspection object, obtained by the adhesive information obtaining unit is higher than a melting temperature of each of the solders included in the solder group, inspection of each of the solders included in the solder group is performed, at least based on actual inspection reference information obtained by shifting the ideal solder inspection reference information by the mounting position adjustment information with regard to the solder group, and the mounting position adjustment information is output to the component mounting machine by the mounting position adjustment information output unit.

When the curing temperature of the adhesive, which is used to fix the electronic component corresponding to the solder group that is the inspection object, obtained by the adhesive information obtaining unit is higher than the melting temperature of the solders included in the solder group, i.e., under the condition that the self-alignment effect is likely to be exerted, the configuration of the above aspect 2 performs inspection of each of the solders included in the solder group on the basis of the actual inspection reference information that is obtained by shifting the ideal solder inspection reference information by the mounting position adjustment information. In other words, under the condition that the self-alignment effect is likely to be exerted, the configuration of the aspect 2 takes into account this condition to change a reference position of inspection in the unit of each electronic component (in the unit of each solder group), based on the positions of actually printed solders, and performs inspection of each of the solders, based on this changed reference position. This configuration accordingly enables the printing quality of the solders to be appropriately inspected by taking into account exertion of the self-alignment effect.

Furthermore, when the curing temperature of the adhesive is higher than the melting temperature of the solder, the configuration of the above aspect 2 outputs the mounting position adjustment information, which is information based on the amount of positional misalignment and the direction of positional misalignment of the actual solder position information relative to the ideal solder position information, to the component mounting machine. This configuration accordingly enables an electronic component to be placed at a position determined by taking into account the self-alignment effect and more reliably mounts the electronic component at an appropriate position. This configuration utilizes the information that is generated in an inspection process, for a mounting process. There is accordingly no need to perform a series of processing, which is similar to that performed in the inspection process, in a duplicated manner in the mounting process. This improves the manufacturing efficiency.

Aspect 3. According to one or more embodiments, there is provided a solder printing inspection device placed on an upstream side of a component mounting machine, which is used to mount an electronic component on solder printed on a substrate by a solder printing machine, and configured to inspect the solder on the substrate with a thermosetting adhesive applied thereon. The solder printing inspection device comprises an irradiation unit configured to irradiate at least the solder with light; an imaging unit configured to take an image of at least the solder irradiated with the light; an actual solder position information generating unit configured to generate actual solder position information that is position information of a solder group, which includes two or more solders and which the electronic component is mounted on, based on image data taken by the imaging unit; an ideal solder inspection reference information generating unit configured to generate ideal solder inspection reference information, which indicates a reference inspection position and/or a reference inspection range of the solder included in the solder group, based on design data or manufacturing data; a mounting position adjustment information output unit configured to output mounting position adjustment information to the component mounting machine, wherein the mounting position adjustment information is information that indicates an amount of positional misalignment and a direction of positional misalignment of expected mounting position information indicating an expected mounting position of the electronic component, relative to ideal mounting position information indicating an ideal mounting position of the electronic component and that is based on an amount of positional misalignment and a direction of positional misalignment of the actual solder position information relative to ideal solder position information indicating a position of the solder group on the design data or on the manufacturing data; and an adhesive information obtaining unit configured to obtain information with regard to a curing temperature of the adhesive.

When the curing temperature of the adhesive, which is used to fix the electronic component corresponding to the solder group that is a predetermined inspection object, obtained by the adhesive information obtaining unit is lower than a melting temperature of each of the solders included in the solder group, inspection of each of the solders included in the solder group is performed, at least based on the ideal solder inspection reference information with regard to the solder group.

When the curing temperature of the adhesive, which is used to fix the electronic component corresponding to the solder group that is the inspection object, obtained by the adhesive information obtaining unit is lower than the melting temperature of the solders included in the solder group, the configuration of the above aspect 3 performs inspection of each of the solders included in the solder group on the basis of the ideal solder inspection reference information. In other words, under the condition that the self-alignment effect is not exerted or is unlikely to be exerted, the configuration of the aspect 3 performs inspection of each of the solders based on the positions and the regions of the respective solders on design data or on manufacturing data (ideal positions and ideal regions of respective solders on an eventually produced substrate). This configuration accordingly enables the printing quality of the solders to be appropriately inspected by taking into account non-exertion or improbable exertion of the self-alignment effect.

In the case where the self-alignment effect is likely to be exerted, the configuration of the above aspect 3 enables information regarding the mounting position of an electronic component (mounting position adjustment information) by taking into account the self-alignment effect to be output by the mounting position adjustment information output unit.

Aspect 4. According to one or more embodiments, in the solder printing inspection device described in any of the above aspects 1 to 3, when the electronic component corresponding to the solder group that is the predetermined inspection object is not to be fixed by the adhesive, the mounting position adjustment information with regard to the solder group may be output to the component mounting machine by the mounting position adjustment information output unit.

When the electronic component is not to be fixed by the adhesive, the mounting position adjustment information is output to the component mounting machine as the information relating to the mounting position of the electronic component, irrespective of the curing temperature of the adhesive. In other words, the mounting position adjustment information is output with regard to the electronic component that is movable by the self-alignment effect. This configuration accordingly enables the electronic component to be placed at a position determined by taking into account the self-alignment effect and more reliably mounts the electronic component at an appropriate position. Additionally, this configuration utilizes the information that is generated in an inspection process, for a mounting process. There is accordingly no need to perform a series of processing, which is similar to that performed in the inspection process, in a duplicated manner in the mounting process. This more effectively improves the manufacturing efficiency.

Aspect 5. According to one or more embodiments, there is provided a component mounting system. The component mounting system comprises a solder printing inspection device and a component mounting machine, which are placed on a downstream side of a solder printing machine configured to print a solder on a substrate, wherein the solder printing inspection device is configured to inspect the solder on the substrate with a thermosetting adhesive applied thereon, and the component mounting machine is configured to mount an electronic component on the printed solder.

The solder printing inspection device comprises an irradiation unit configured to irradiate at least the solder with light; an imaging unit configured to take an image of at least the solder irradiated with the light; an actual solder position information generating unit configured to generate actual solder position information that is position information of a solder group, which includes two or more solders and which the electronic component is mounted on, based on image data taken by the imaging unit; an ideal solder inspection reference information generating unit configured to generate ideal solder inspection reference information, which indicates a reference inspection position and/or a reference inspection range of the solder included in the solder group, based on design data or manufacturing data; a mounting position adjustment information output unit configured to output mounting position adjustment information to the component mounting machine, wherein the mounting position adjustment information is information that indicates an amount of positional misalignment and a direction of positional misalignment of expected mounting position information indicating an expected mounting position of the electronic component, relative to ideal mounting position information indicating an ideal mounting position of the electronic component and that is based on an amount of positional misalignment and a direction of positional misalignment of the actual solder position information relative to ideal solder position information indicating a position of the solder group on the design data or on the manufacturing data; and an adhesive information obtaining unit configured to obtain information with regard to a curing temperature of the adhesive.

When the curing temperature of the adhesive, which is used to fix the electronic component corresponding to the solder group that is a predetermined inspection object, obtained by the adhesive information obtaining unit is higher than a melting temperature of each of the solders included in the solder group, the solder printing inspection device performs inspection of each of the solders included in the solder group, based on actual inspection reference information obtained by shifting the ideal solder inspection reference information by the mounting position adjustment information with regard to the solder group, and causes the mounting position adjustment information to be output to the component mounting machine by the mounting position adjustment information output unit. The component mounting machine mounts the electronic component at a position determined by shifting the ideal mounting position information by the mounting position adjustment information.

When the curing temperature of the adhesive, which is used to fix the electronic component corresponding to the solder group that is the inspection object, obtained by the adhesive information obtaining unit is lower than the melting temperature of each of the solders included in the solder group, the solder printing inspection device performs inspection of each of the solders included in the solder group, based on the ideal solder inspection reference information with regard to the solder group. The component mounting machine mounts the electronic component at a position indicated by the ideal mounting position information with regard to the solder group.

The configuration of the above aspect 5 has substantially similar functions and advantageous effects to those of the aspect 1 described above.

Aspect 6. According to one or more embodiments, there is provided a component mounting system. The component mounting system comprises a solder printing inspection device and a component mounting machine, which are placed on a downstream side of a solder printing machine configured to print a solder on a substrate, wherein the solder printing inspection device is configured to inspect the solder on the substrate with a thermosetting adhesive applied thereon, and the component mounting machine is configured to mount an electronic component on the printed solder.

The solder printing inspection device comprises an irradiation unit configured to irradiate at least the solder with light; an imaging unit configured to take an image of at least the solder irradiated with the light; an actual solder position information generating unit configured to generate actual solder position information that is position information of a solder group, which includes two or more solders and which the electronic component is mounted on, based on image data taken by the imaging unit; an ideal solder inspection reference information generating unit configured to generate ideal solder inspection reference information, which indicates a reference inspection position and/or a reference inspection range of the solder included in the solder group, based on design data or manufacturing data; a mounting position adjustment information output unit configured to output mounting position adjustment information to the component mounting machine, wherein the mounting position adjustment information is information that indicates an amount of positional misalignment and a direction of positional misalignment of expected mounting position information indicating an expected mounting position of the electronic component, relative to ideal mounting position information indicating an ideal mounting position of the electronic component and that is based on an amount of positional misalignment and a direction of positional misalignment of the actual solder position information relative to ideal solder position information indicating a position of the solder group on the design data or on the manufacturing data; and an adhesive information obtaining unit configured to obtain information with regard to a curing temperature of the adhesive.

When the curing temperature of the adhesive, which is used to fix the electronic component corresponding to the solder group that is a predetermined inspection object, obtained by the adhesive information obtaining unit is higher than a melting temperature of each of the solders included in the solder group, the solder printing inspection device performs inspection of each of the solders included in the solder group, at least based on actual inspection reference information obtained by shifting the ideal solder inspection reference information by the mounting position adjustment information with regard to the solder group, and causes the mounting position adjustment information to be output to the component mounting machine by the mounting position adjustment information output unit. The component mounting machine mounts the electronic component at a position determined by shifting the ideal mounting position information by the mounting position adjustment information.

The configuration of the above aspect 6 has substantially similar functions and advantageous effects to those of the aspect 2 described above.

Aspect 7. According to one or more embodiments, there is provided a component mounting system. The component mounting system comprises a solder printing inspection device and a component mounting machine, which are placed on a downstream side of a solder printing machine configured to print a solder on a substrate, wherein the solder printing inspection device is configured to inspect the solder on the substrate with a thermosetting adhesive applied thereon, and the component mounting machine is configured to mount an electronic component on the printed solder.

The solder printing inspection device comprises an irradiation unit configured to irradiate at least the solder with light; an imaging unit configured to take an image of at least the solder irradiated with the light; an actual solder position information generating unit configured to generate actual solder position information that is position information of a solder group, which includes two or more solders and which the electronic component is mounted on, based on image data taken by the imaging unit; an ideal solder inspection reference information generating unit configured to generate ideal solder inspection reference information, which indicates a reference inspection position and/or a reference inspection range of the solder included in the solder group, based on design data or manufacturing data; a mounting position adjustment information output unit configured to output mounting position adjustment information to the component mounting machine, wherein the mounting position adjustment information is information that indicates an amount of positional misalignment and a direction of positional misalignment of expected mounting position information indicating an expected mounting position of the electronic component, relative to ideal mounting position information indicating an ideal mounting position of the electronic component and that is based on an amount of positional misalignment and a direction of positional misalignment of the actual solder position information relative to ideal solder position information indicating a position of the solder group on the design data or on the manufacturing data; and an adhesive information obtaining unit configured to obtain information with regard to a curing temperature of the adhesive.

When the curing temperature of the adhesive, which is used to fix the electronic component corresponding to the solder group that is a predetermined inspection object, obtained by the adhesive information obtaining unit is lower than a melting temperature of each of the solders included in the solder group, the solder printing inspection device performs inspection of each of the solders included in the solder group, at least based on the ideal solder inspection reference information with regard to the solder group. The component mounting machine mounts the electronic component at a position indicated by the ideal mounting position information with regard to the solder group.

The configuration of the above aspect 7 has substantially similar functions and advantageous effects to those of the aspect 3 described above.

Aspect 8. According to one or more embodiments, in the component mounting system described in any of the above aspects 5 to 7, when the electronic component corresponding to the solder group that is a predetermined inspection object is not to be fixed by the adhesive, the solder printing inspection device may cause the mounting position adjustment information with regard to the solder group to be output to the component mounting machine by the mounting position adjustment information output unit. The component mounting machine may mount the electronic component at a position determined by shifting the ideal mounting position information by the mounting position adjustment information.

The configuration of the above aspect 8 has similar functions and advantageous effects to those of the aspect 4 described above.

Aspect 9. According to one or more embodiments, there is provided a solder printing inspection method that inspects solder printed on a substrate with a thermosetting adhesive applied thereon in a stage prior to mounting an electronic component on the solder printed on the substrate by using a component mounting machine. The solder printing inspection method comprises: an irradiation process of irradiating at least the solder with light; an imaging process of taking an image of at least the solder irradiated with the light; an actual solder position information generating process of generating actual solder position information that is position information of a solder group, which includes two or more solders and which the electronic component is mounted on, based on image data taken in the imaging process; an ideal solder inspection reference information generating process of generating ideal solder inspection reference information, which indicates a reference inspection position and/or a reference inspection range of the solder included in the solder group, based on design data or manufacturing data; a mounting position adjustment information output process of outputting mounting position adjustment information to the component mounting machine, wherein the mounting position adjustment information is information that indicates an amount of positional misalignment and a direction of positional misalignment of expected mounting position information indicating an expected mounting position of the electronic component, relative to ideal mounting position information indicating an ideal mounting position of the electronic component and that is based on an amount of positional misalignment and a direction of positional misalignment of the actual solder position information relative to ideal solder position information indicating a position of the solder group on the design data or on the manufacturing data; and an adhesive information obtaining process of obtaining information with regard to a curing temperature of the adhesive.

When the curing temperature of the adhesive, which is used to fix the electronic component corresponding to the solder group that is a predetermined inspection object, obtained in the adhesive information obtaining process is higher than a melting temperature of each of the solders included in the solder group, the solder printing inspection method performing inspection of each of the solders included in the solder group, at least based on actual inspection reference information obtained by shifting the ideal solder inspection reference information by the mounting position adjustment information with regard to the solder group, and outputting the mounting position adjustment information to the component mounting machine in the mounting position adjustment information output process.

Aspect 10. According to one or more embodiments, there is provided a solder printing inspection method that inspects solder printed on a substrate with a thermosetting adhesive applied thereon in a stage prior to mounting an electronic component on the solder printed on the substrate by using a component mounting machine. The solder printing inspection method comprises an irradiation process of irradiating at least the solder with light; an imaging process of taking an image of at least the solder irradiated with the light; an actual solder position information generating process of generating actual solder position information that is position information of a solder group, which includes two or more solders and which the electronic component is mounted on, based on image data taken in the imaging process; an ideal solder inspection reference information generating process of generating ideal solder inspection reference information, which indicates a reference inspection position and/or a reference inspection range of the solder included in the solder group, based on design data or manufacturing data; a mounting position adjustment information output process of outputting mounting position adjustment information to the component mounting machine, wherein the mounting position adjustment information is information that indicates an amount of positional misalignment and a direction of positional misalignment of expected mounting position information indicating an expected mounting position of the electronic component, relative to ideal mounting position information indicating an ideal mounting position of the electronic component and that is based on an amount of positional misalignment and a direction of positional misalignment of the actual solder position information relative to ideal solder position information indicating a position of the solder group on the design data or on the manufacturing data; and an adhesive information obtaining process of obtaining information with regard to a curing temperature of the adhesive.

When the curing temperature of the adhesive, which is used to fix the electronic component corresponding to the solder group that is a predetermined inspection object, obtained in the adhesive information obtaining process is lower than a melting temperature of each of the solders included in the solder group, the solder printing inspection method performing inspection of each of the solders included in the solder group, at least based on the ideal solder inspection reference information with regard to the solder group.

Aspect 11. According to one or more embodiments, there is provided a method of manufacturing a substrate. The manufacturing method comprises a solder printing process of printing solder on a substrate; an adhesive applying process of applying an adhesive on the substrate; a substrate inspection process of performing inspection of at least the solder by using the solder printing inspection method described in either the above aspect 9 or the above aspect 10; a component mounting process of mounting an electronic component on the substrate after the inspection; and a reflow process of heating and melting the solder, as well as heating and curing the adhesive.

DETAILED DESCRIPTION

Figure 1:
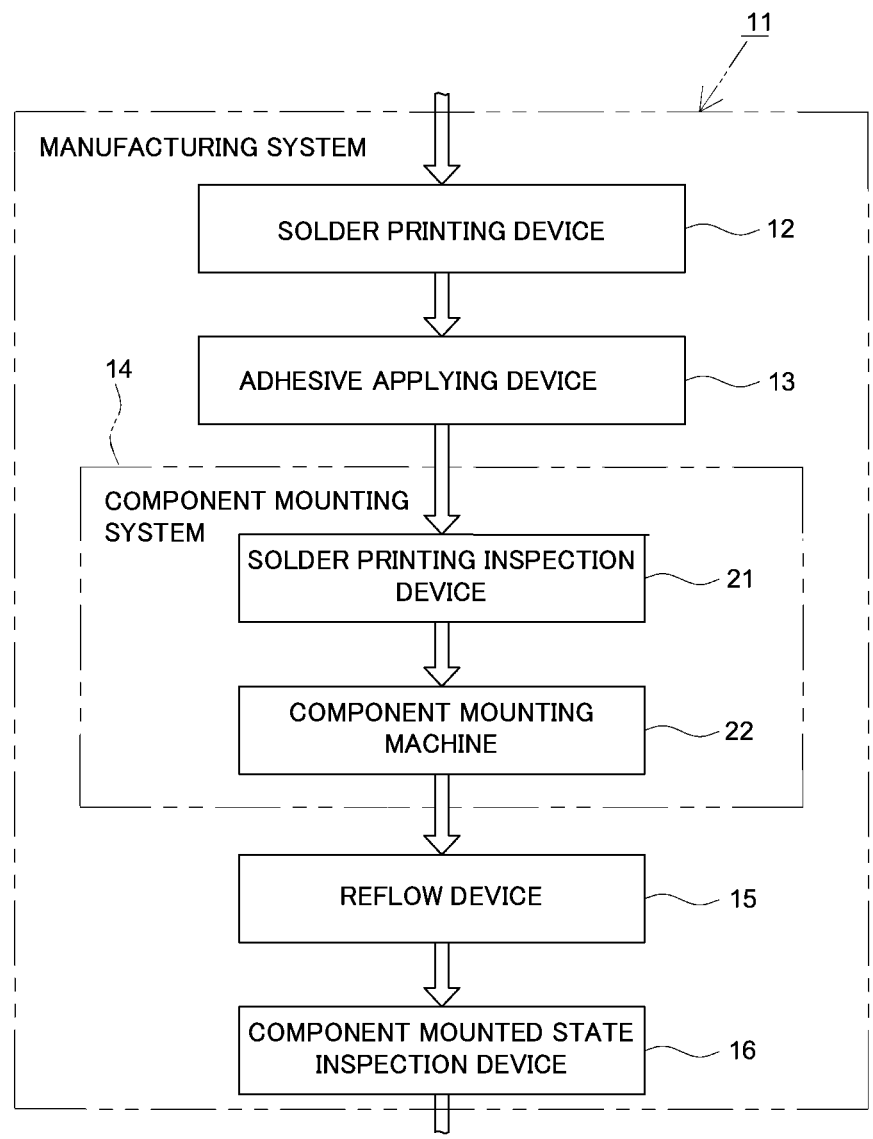
FIG. 1 is a block diagram illustrating the schematic configuration of a manufacturing system according to one or more embodiments.
Figure 2:
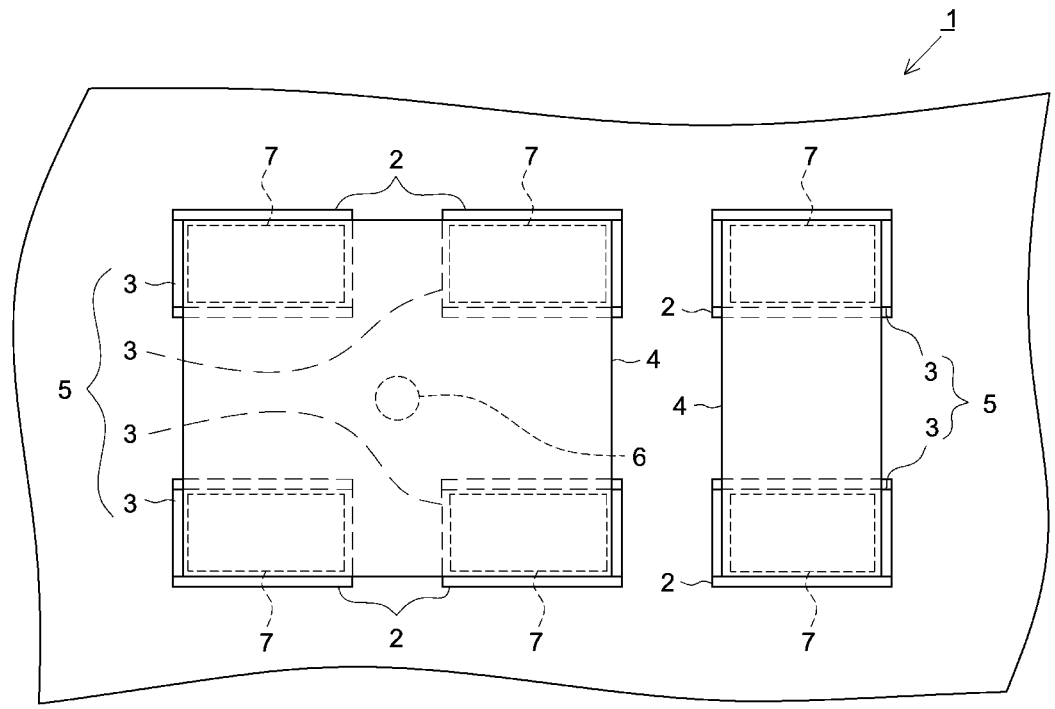
FIG. 2 is a partly enlarged plan view illustrating the schematic configuration of a printed circuit board according to one or more embodiments.
Figure 3:
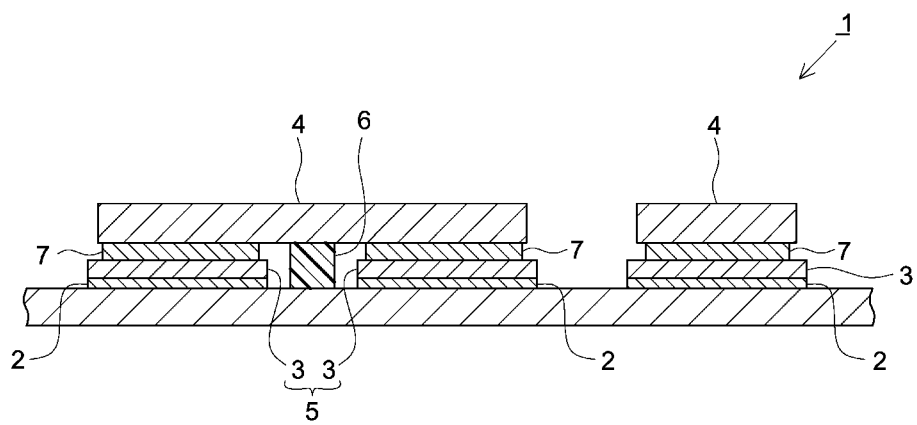
FIG. 3 is a partly enlarged sectional view illustrating the schematic configuration of the printed circuit board according to one or more embodiments.

The following describes embodiments of the present invention with reference to the drawings. FIG. 1 is a block diagram illustrating the schematic configuration of a manufacturing system to manufacture a printed circuit board (hereinafter referred to as "substrate") according to one or more embodiments. FIG. 2 is a partly enlarged plan view illustrating part of the substrate 1. FIG. 3 is a partly enlarged sectional view illustrating part of the substrate 1.

The configuration of the substrate 1 is described first. As shown in FIG. 2 and FIG. 3, the substrate 1 has a plurality of electrode patterns 2 having electrical conductivity. Solder paste having viscosity (hereinafter referred to as "solder") 3 is printed on the electrode patterns 2.

The solder 3 used may be, for example, an Sn—Ag-based solder such as Sn-3.0 Ag-0.5 Cu or Sn-0.3 Ag-0.7 Cu, an Sn—Cu-based solder such as Sn-0.7 Cu, an Sn—Zn-based solder such as Sn-8 Zn-3 Bi, or an Sn—Pb-based solder such as Sn 67%-Pb 37%. According to one or more embodiments, the solders 3 printed on the respective parts of the substrate 1 do not differ from one another, but one identical type of the solder 3 is printed on the respective parts of the substrate 1.

For reference, the melting temperature (melting point) of the solder 3 made of Sn-3.0 Ag-0.5 Cu or Sn-0.3 Ag-0.7 Cu is about 217° C., and the melting temperature (melting point) of the solder 3 made of Sn-0.7 Cu is about 227° C. The melting temperature (melting point) of the solder 3 made of Sn-8 Zn-3 Bi is about 187 to 196° C., and the melting temperature (melting point) of the solder 3 made of Sn 67%-Pb 37% is about 183° C.

Electronic components 4 such as a chip or the like are mounted on the solders 3. More specifically, the electronic component 4 includes a plurality of electrode portions 7 comprised of electrodes and leads. Each of the electrode portions 7 is joined with each predetermined solder 3.

Accordingly, the electronic component 4 is mounted on one solder group 5 consisting of a plurality of the solders 3.

Additionally, each of the electronic components 4 mounted on the substrate 1 is fixed by the solders 3. With a view to enhancing the fixation, at least one of the electronic components 4 is bonded by means of an adhesive 6 applied on the substrate 1. According to one or more embodiments, however, at least one of the electronic components 4 is not fixed by the adhesive 6.

The adhesive 6 is an insulating adhesive having thermosetting property. The curing temperature of the adhesive 6 differs by the type of the adhesive 6 used and may be higher than the melting temperature of the solder 3 or may be lower than the melting temperature of the solder 3. According to one or more embodiments, one identical type of the adhesive 6 is applied on the respective parts of the substrate 1.

The following describes a manufacturing system 11 configured to manufacture the substrate 1. As shown in FIG. 1, the manufacturing system 11 of one or more embodiments includes a solder printing device 12 as a solder printing machine, an adhesive applying device 13, a component mounting system 14, a reflow device 15 and a component mounted state inspection device 16, which are arranged along a transfer line of the substrate 1 sequentially from an upstream side (upper side of the drawing).

The solder printing device 12 is configured to print a predetermined amount of the solder 3 at a predetermined position of the substrate 1 (for example, on the electrode pattern 2). More specifically, the solder printing device 12 is provided with a metal screen (not shown) having a plurality of holes at positions corresponding to the electrode patterns 2 on the substrate 1. The solder printing device 12 uses this metal screen to screen-print the solder 3 on the substrate 1.

The adhesive applying device 13 is configured to apply a predetermined amount of the adhesive 6 at a predetermined position of the substrate 1 (for example, at a position where a predetermined electronic component 4 is expected to be placed). The adhesive applying device 13 is provided with, for example, a nozzle head (not shown) configured to be movable in an X-Y direction and ejects the adhesive 6 from this nozzle head to apply the adhesive 6 onto the substrate 1.

The component mounting system 14 includes a solder printing inspection device 21 configured to inspect the printed solder 3 and a component mounting machine 22 configured to mount the electronic components 4. The solder printing inspection device 21 and the component mounting machine 22 will be described later in detail.

The reflow device 15 is configured to heat and melt the solder 3, as well as to heat and cure the adhesive 6. In the substrate 1 after a reflow process performed by the reflow device 15, the electrode portions 7 of the electronic components 4 are joined with the electrode patterns 2 by means of the solders 3, and the electronic component 4 is securely fixed by the adhesive 6.

The component mounted state inspection device 16 is configured to inspect whether each of the electronic components 4 is mounted at a predetermined position and to inspect whether the electrical continuity to each of the electronic components 4 is appropriately ensured The following describes the component mounting system 14. The solder printing inspection device 21 is described first.

Figure 4:
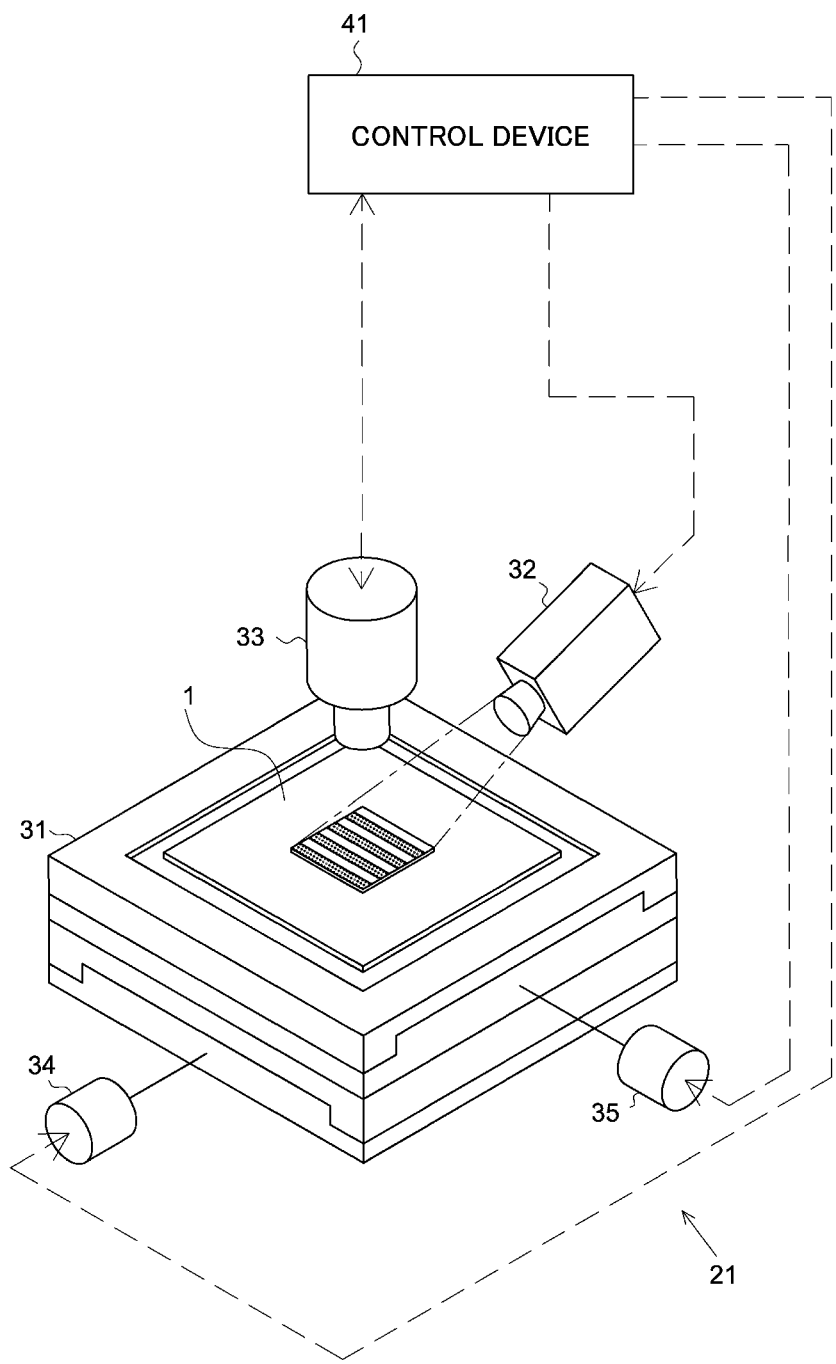
FIG. 4 is a schematic diagram illustrating the schematic configuration of a solder printing inspection device and the like according to one or more embodiments.

As shown in FIG. 4, the solder printing inspection device 21 includes a mounting table 31 configured such that the substrate 1 is placed on the mounting table 31; an illumination device 32 configured as the irradiation unit (irradiator) to irradiate the surface of the substrate 1 obliquely downward with light; a CCD camera 33 configured as the imaging unit (imaging device) to take an image of the substrate 1 irradiated with the light; and a control device (processor) 41 configured to perform various controls, image processing, arithmetic processing in the solder printing inspection device 21.

The mounting table 31 is provided with motors 34 and 35 that respectively have rotating shafts arranged to be orthogonal to each other. The control device 41 drives and controls these motors 34 and 35, such as to slidably move the substrate 1 placed on the mounting table 31 in an arbitrary direction (X-axis direction and Y-axis direction). This changes an imaging site of the substrate 1 by the CCD camera 33.

The illumination device 32 is configured to irradiate the substrate 1 with predetermined light and to radiate light to at least the solder 3.

The CCD camera 33 has sensitivity to a wavelength range of the light radiated from the illumination device 32 and is configured to take an image of at least the solder 3 irradiated with the light. Image data taken by the CCD camera 33 is transferred to an arithmetic device 43 of the control device 41 described later. According to one or more embodiments, the image data transferred is luminance data with regard to reflected light from the substrate 1. The image data transferred is, however, not limited to the luminance data but may be color data, height data or the like of the substrate 1.

Figure 5:
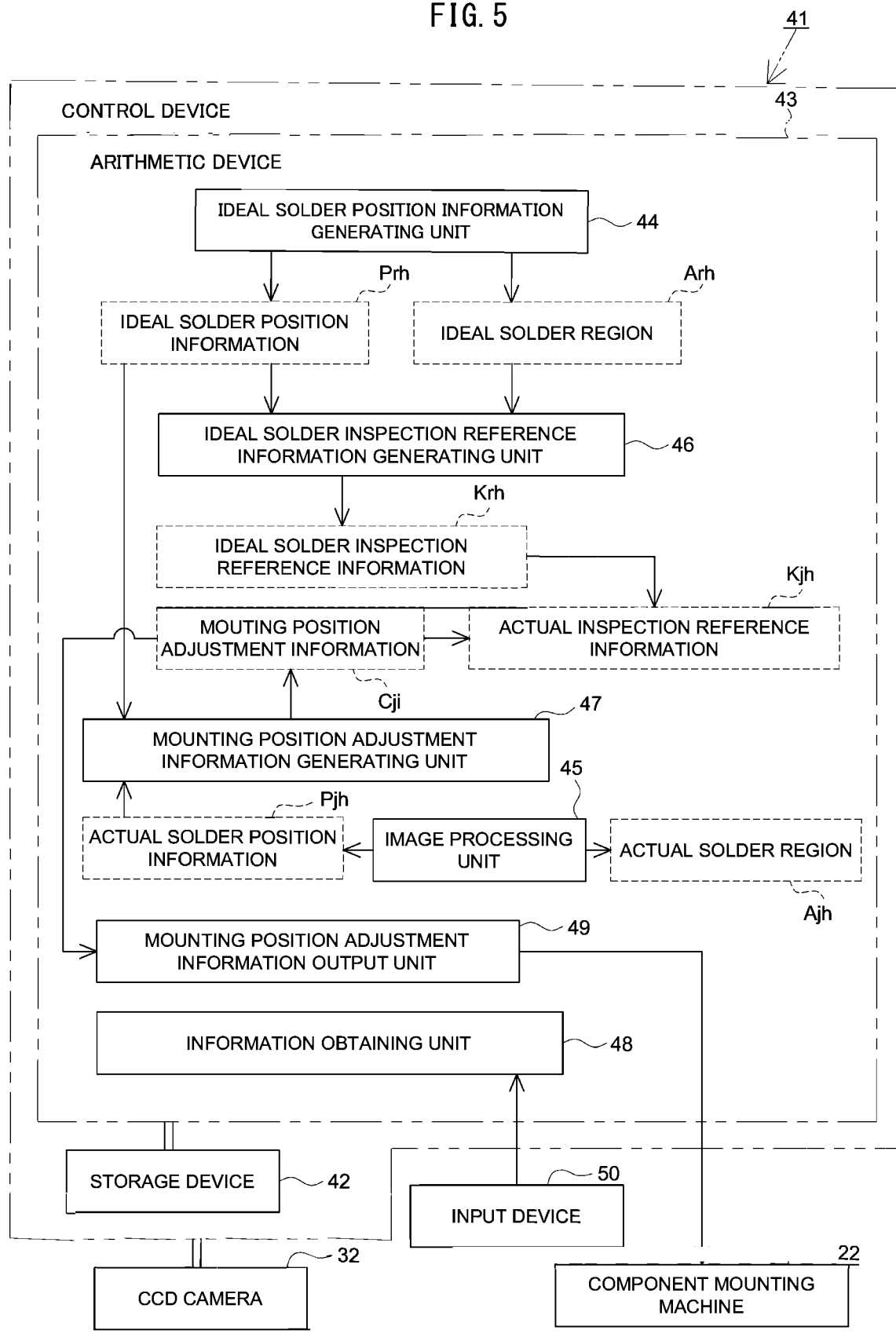
FIG. 5 is a block diagram illustrating the configuration of a control device and the like according to one or more embodiments.

The following describes the control device 41. As shown in FIG. 5, the control device 41 includes a storage device 42 configured to store various data and an arithmetic device (arithmetic circuit) 43 configured to perform various arithmetic operations. FIG. 5 illustrates regions and pieces of information provided by respective units 44 to 47 described later, as well as the respective components of the control device 41. These regions and pieces of information are shown by dotted-line boxes in FIG. 5.

The storage device 42 stores results of calculations performed by the arithmetic device 43, as well as design data, manufacturing data and the like with regard to the substrate 1. According to one or more embodiments, the storage device 42 stores, for example, the positions and the sizes of the electrode patterns 2 on the substrate 1, the expected printing positions of the solders 3, the type of the solders 3, the melting temperature of each type of the solder 3, the sizes of the solders 3 (for example, the length of each side of the solder 3, the area and the contour length of the solder 3, the length of the diagonal of the solder 3, the volume of the solder 3 and the like) in an ideal printing state, various pieces of information with regard to the electronic components 4 including information regarding whether each of the electronic components 4 is to be fixed by the adhesive 6 and the expected placement region of each of the electronic components 4, and the size of the substrate 1, as the design data and the manufacturing data. The storage device 42 also stores, for example, information regarding which solder 3 is used to mount each of the electronic components 4 and information regarding which solder 3 is included in which solder group 5.

The arithmetic device 43 includes an ideal solder position information generating unit 44, an image processing unit 45, an ideal solder inspection reference information generating unit 46, a mounting position adjustment information generating unit 47, an information obtaining unit 48 serving as an adhesive information obtaining unit, and a mounting position adjustment information output unit 49.

The ideal solder position information generating unit 44 is configured to generate ideal solder position information Prh that indicates an ideal position of each solder group 5 on the design data or on the manufacturing data stored in the storage device 42. According to one or more embodiments, the ideal solder position information generating unit 44 first obtains an ideal solder region Arh of each of the solders 3 included in each solder group 5, based on the data stored in the storage device 42. According to one or more embodiments, the ideal solder region Arh denotes a planar region on the data that is occupied by each of the solders 3 on the substrate 1.

The ideal solder position information generating unit 44 subsequently obtains the center of gravity coordinates with regard to each of the ideal solder regions Arh. When the solder group 5 includes two solders 3, the ideal solder position information generating unit 44 generates center coordinates (i.e., midpoint coordinates) [=(Lx, Ly)] of the two center of gravity coordinates with regard to these two ideal solder regions Arh, as the ideal solder position information Prh. When the solder group 5 includes three or more solders 3, on the other hand, the ideal solder position information generating unit 44 generates center coordinates (i.e., center of gravity coordinates) [=(Lx, Ly)] of the respective center of gravity coordinates with regard to the respective ideal solder regions Arh, as the ideal solder position information Prh.

A three-dimensional region or the like on the data that is occupied by each of the solders 3 on the substrate 1 may also be obtained as the ideal solder region Arh. The center of each ideal solder region Arh, the center of gravity or the center of a rectangle circumscribing each ideal solder region Arh or the like may also be generated as the ideal solder position information Prh. According to one or more embodiments, the ideal solder region Arh is set to be identical with a region occupied by each electrode pattern 2 on the substrate 1.

The image processing unit 45 is configured to extract an actual solder region Ajh, based on the image data taken by the CCD camera 33 and to generate actual solder position information Pjh, based on the extracted actual solder region Ajh.

The actual solder region Ajh basically denotes a region of image data that is occupied by each of the solders 3. The solder 3 having a significant defect of the printing quality is, however, not extracted as the actual solder region Ajh. The actual solder position information Pjh denotes position information of image data with regard to each solder group 5 actually printed.

The extraction of the actual solder region Ajh is described more. The image processing unit 45 first performs a binarization process of the image data using a predetermined luminance value specified in advance as a reference value and thereby extracts a planar region occupied by each of the solders 3 on the substrate 1. The image processing unit 45 then stores information with regard to the extracted planar region of each of the solders 3 into the storage device 42.

The image processing unit 45 subsequently sets a predetermined solder search region. The solder search region has a shape similar to the shape of each of the ideal solder regions Arh and has center coordinates that are identical with the center coordinates of the ideal solder region Arh. The solder search region is, however, set to be slightly larger than the ideal solder region Arh.

The image processing unit 45 subsequently uses the information with regard to the planar region of each of the solders 3 stored in the storage device 42 and determines whether the area of the planar region of the solder 3 that is present in the solder search region occupies a predetermined or higher ratio of the area of the solder search region. When this determination condition is satisfied, the image processing unit 45 extracts the solder 3 that is present in the solder search region, as a solder bump. A planar region of less than a predetermined area (for example, less than 1% of the area of the solder search region) in the planar region of the solder 3 that is present in the solder search region is, however, not extracted as part of a solder bump.

The image processing unit 45 then extracts a solder region to be linked with the extracted solder bump (i.e., a solder region including the extracted solder bump) as the actual solder region Ajh, based on the information regarding the planar region of the solder 3 stored in the storage device 42. This extracts the actual solder region Ajh with regard to each of the solders 3 included in the solder group 5, except the solder 3 having a significant defect of the printing quality.

When the area of the planar region of the solder 3 that is present in the solder search region is less than the predetermined ratio of the area of the solder search region, on the other hand, the image processing unit 45 does not extract this solder 3 as a solder bump but outputs a "printing failure signal" to the component mounting machine 22. This process is performed, since printing the solder 3 at a position significantly deviated from its ideal printing position is likely to cause difficulty in correcting the position of the solder 3 later even when the self-alignment effect is exerted. The operations of the component mounting machine 22 in response to the input of the "printing failure signal" will be described later.

When a plurality of planar regions of the solder 3, each having a predetermined or larger area (for example, 20% or higher percentage of the area of the solder search region), are present in the solder search region, The image processing unit 45 does not extract this solder as a solder bump but outputs the "printing failure signal" to the component mounting machine 22. This process is performed since the solder 3 is likely to be excessively close to an adjacent solder 3 due to "bleeding" or the like or the solder 3 is likely to blur.

The following describes generation of the actual solder position information Pjh. The image processing unit 45 first determines the center of gravity coordinates with regard to each of the actual solder regions Ajh included in each solder group 5. When the solder group 5 includes two solders 3, the image processing unit 45 generates center coordinates (i.e., midpoint coordinates) [=(x, y)] of the two center of gravity coordinates with regard to these two actual solder regions Ajh included in the solder group 5, as the actual solder position information Pjh. When the solder group 5 includes three or more solders 3, on the other hand, the image processing unit 45 generates center coordinates (i.e., center of gravity coordinates) [=(x, y)] of the respective center of gravity coordinates with regard to the plurality of actual solder regions Ajh included in the, as the actual solder position information Pjh. According to one or more embodiments, the image processing unit 45 corresponds to the actual solder position information generating unit.

For example, the center coordinates (center of gravity coordinates) of each actual solder region Ajh, the center of gravity or the center of a rectangle circumscribing each actual solder region Ajh or the like may be generated as the actual solder position information Pjh. The actual solder position information Pjh, however, needs to be an identical type with the type of (i.e., to have identical types of category and parameters with those of) the ideal solder position information Prh. According to one or more embodiments, as described above, the center coordinates of the center of gravity coordinates of the ideal solder region Arh are generated as the ideal solder position information Prh, and the center coordinates of the center of gravity coordinates of the actual solder region Ajh are generated as the actual solder position information Pjh.

The ideal solder inspection reference information generating unit 46 is configured to generate ideal solder inspection reference information Krh that indicates an inspection range corresponding to the ideal solder region Arh. According to one or more embodiments, the ideal solder inspection reference information generating unit 46 generates the ideal solder inspection reference information Krh, based on the ideal solder region Arh obtained by the ideal solder position information generating unit 44.

More specifically, the ideal solder inspection reference information generating unit 46 generates an ideal solder inspection window that has a similar shape to the shape of the ideal solder region Arh and that has center coordinates identical with the center coordinates of the ideal solder region Arh, as the ideal solder inspection reference information Krh. This ideal solder inspection window indicates an inspection reference range of each solder 3 included in the solder group 5. The ideal solder inspection window is set to have a size slightly larger than the size of the ideal solder region Arh. The ideal solder inspection reference information Krh may be changed appropriately with a changed in the ideal solder region Arh.

The mounting position adjustment information generating unit 47 is configured to generate mounting position adjustment information Cji with regard to each solder group 5 or in other words with regard to each of the electronic components 4. The mounting position adjustment information Cji shows an amount of positional misalignment and a direction of positional misalignment of expected mounting position information relative to ideal mounting position information. The ideal mounting position information shows a mounting position on the design data or on the manufacturing data with regard to the electronic component 4 that is to be mounted on the solder group 5, and is identical with the ideal solder position information Prh according to one or more embodiments. The expected mounting position information shows an expected mounting position of the electronic component 4 that is to be mounted on the solder group 5, and is identical with the actual solder position information Pjh according to one or more embodiments.

According to one or more embodiments, the mounting position adjustment information Cji is generated, based on the amount of positional misalignment and the direction of positional misalignment of the actual solder position information Pjh relative to the ideal solder position information Prh. More specifically, vector information based on the actual solder position information Pjh [=(x, y)] and the ideal solder position information Prh [=(Lx, Ly)] is generated as the mounting position adjustment information Cji. An X component of the mounting position adjustment information Cji is "x-Lx" and a Y component of the mounting position adjustment information Cji is "y-Ly".

The information obtaining unit 48 is configured to obtain information regarding the curing temperature of the adhesive 6 applied on the substrate 1 and the type of the solder 3 printed on the substrate 1. According to one or more embodiments, the information obtaining unit 48 is comprised of, for example, a keyboard and a touch panel and obtains information regarding the curing temperature of the adhesive 6 and the type of the solder 3 via a predetermined input device 50 that is electrically connected with the control device 41.

The mounting position adjustment information output unit 49 is configured to output information for position adjustment that is used in the process of determining the actual mounting position of each of the electronic components 4, to the component mounting machine 22. According to one or more embodiments, the mounting position adjustment information output unit 49 first uses the information regarding the type of the solder 3 obtained by the information obtaining unit 48 to extract information regarding the melting temperature of the solder 3 from the storage device 42. The mounting position adjustment information output unit 49 subsequently compares the melting temperature of the solder 3 indicated by the extracted information with the curing temperature of the adhesive 6 obtained by the information obtaining unit 48. The mounting position adjustment information output unit 49 also uses the data stored in the storage device 42 to check whether each of the electronic components 4 is to be fixed by the adhesive 6.

When the curing temperature of the adhesive 6 is higher than the melting temperature of the solder 3, the mounting position adjustment information output unit 49 outputs the mounting position adjustment information Cji as the information for position adjustment with regard to the electronic component 4, irrespective of whether the electronic component 4 is to be fixed by the adhesive 6.

When the curing temperature of the adhesive 6 is lower than the melting temperature of the solder 3 and the electronic component 4 is to be fixed by the adhesive 6, on the other hand, the mounting position adjustment information output unit 49 outputs a non-adjustment signal as the information for position adjustment with regard to the electronic component 4. The operations of the component mounting machine 22 in response to input of the non-adjustment signal will be described later.

When the curing temperature of the adhesive 6 is lower than the melting temperature of the solder 3 but the electronic component 4 is not to be fixed by the adhesive 6, on the contrary, the mounting position adjustment information output unit 49 outputs the mounting position adjustment information Cji as the information for position adjustment with regard to the electronic component 4. The mounting position adjustment information Cji or the non-adjustment signal is output only when the solder group 5 is determined to have "good quality" in inspection of the solder group 5 by the arithmetic device 43 described below.

The following describes an inspection process of each solder group 5 by the arithmetic device 42. The arithmetic device 43 inspects the good/poor quality of the solder group 5 on the substrate 1, based on, for example, the information generated by the respective units 44 to 48 described above.

The arithmetic device 43 checks whether each of multiple pieces of the mounting position adjustment information Cji obtained by the mounting position adjustment information generating unit 47 is appropriate. More specifically, when the size of the mounting position adjustment information Cji, the magnitude of the X direction component of the mounting position adjustment information Cji or the magnitude of the Y direction component of the mounting position adjustment information Cji exceeds each predetermined reference value that is set in advance, the arithmetic device 43 determines that the solder 3 is printed at a significantly deviated position and has a poor printing quality. In this case, the arithmetic device 43 outputs the "printing failure signal" to the component mounting machine 22.

Furthermore, when each of the mounting position adjustment information Cji is appropriate, the arithmetic device 43 shifts the ideal solder inspection reference information Krh (ideal solder inspection window) by the mounting position adjustment information Cji to generate actual inspection reference information Kjh. According to one or more embodiments, the arithmetic device 43 generates an inspection window (actual solder inspection window) by shifting the ideal solder inspection reference information Krh (ideal solder inspection window) by the mounting position adjustment information Cji, as the actual inspection reference information Kjh. The actual solder inspection window has center coordinates that are identical with coordinates determined by shifting the center coordinates of the ideal solder inspection window by the mounting position adjustment information Cji and has a shape that is identical with the shape of the ideal solder inspection window. The actual inspection reference information Kjh is generally generated for each solder group 5.

The arithmetic device 43 subsequently determines an inspection standard with regard to each of the solder groups 5. More specifically, when the curing temperature of the adhesive 6 obtained by the information obtaining unit 48 is higher than the melting temperature of the solder 3, the arithmetic device 43 sets the actual inspection reference information Kjh as the inspection standard of the solder group 5.

When the curing temperature of the adhesive 6 obtained by the information obtaining unit 48 is lower than the melting temperature of the solder 3 and the electronic component 4 corresponding to the solder group 5 as the inspection object is to be fixed by the adhesive 6, on the other hand, the arithmetic device 43 sets the ideal solder inspection reference information Krh (ideal solder inspection window) as the inspection standard of the solder group 5. When the curing temperature of the adhesive 6 obtained by the information obtaining unit 48 is lower than the melting temperature of the solder 3 but the electronic component 4 corresponding to the solder group 5 as the inspection object is not to be fixed by the adhesive 6, on the contrary, the arithmetic device 43 sets the actual inspection reference information Kjh as the inspection standard of the solder group 5.

The arithmetic device 43 subsequently uses the actual inspection reference information Kjh or the ideal solder inspection reference information Krh to inspect each solder group 5. When the curing temperature of the adhesive 6 is higher than the melting temperature of the solder 3 or when the curing temperature of the adhesive 6 is lower than the melting temperature of the solder 3 but the electronic component 4 expected to be mounted on the solder group 5 is not to be fixed by the adhesive 6, the arithmetic device 43 uses the actual inspection reference information Kjh (actual solder inspection window) to inspect the solder group 5. More specifically, the arithmetic device 43 inspects the solder group 5 by determining whether a ratio of a range occupied by a region other than the actual solder region Ajh to the actual inspection reference information Kjh (actual solder inspection window) exceeds a predetermined reference value that is set in advance.

When the curing temperature of the adhesive 6 is lower than the melting temperature of the solder 3 and the electronic component 4 expected to be mounted on the solder group 5 is to be fixed by the adhesive 6, on the other hand, the arithmetic device 43 uses the ideal solder inspection reference information Krh (ideal solder inspection window) to inspect the solder group 5. More specifically, the arithmetic device 43 inspects the solder group 5 by determining whether a ratio of a range occupied by a region other than the actual solder region Ajh to the ideal solder inspection reference information Krh (ideal solder inspection window) exceeds a predetermined reference value that is set in advance.

When all the respective solders 3 on the substrate 1 do not satisfy the condition of the determination described above, the arithmetic device 43 determines that each of the solder groups 5 on the substrate 1 has "good" printing quality.

When at least one solder 3 satisfies the condition of the determination described above, on the other hand, the arithmetic device 43 determines that the solder group 5 on the substrate 1 has "poor" printing quality and outputs the "printing failure signal" to the component mounting machine 22.

When the printing quality of the solders 3 is determined as "good printing quality", the arithmetic device 43 determines that the substrate 1 is a "non-defective product". The arithmetic device 43 (more specifically, the mounting position adjustment information output unit 49) then outputs multiple pieces of the mounting position adjustment information Cji or the non-adjustment signal set with regard to each of the solder groups 5 to the component mounting machine 22.

The following describes the component mounting machine 22. When the mounting position adjustment information Cji or the non-adjustment signal is input after completion of the inspection process by the solder printing inspection device 21, i.e., when the substrate 1 is determined as the "non-defective product", the component mounting machine 22 mounts the electronic component 4 on the substrate 1.

More specifically, when the mounting position adjustment information Cji is input with regard to a certain electronic component 4, the component mounting machine 22 mounts this electronic component 4 on the solder group 5, such that the center of the electronic component 4 is located at a position shifted from mounting position information (ideal mounting position information) of the electronic component 4 on the design data or on the manufacturing data, which is input in advance, by this input mounting position adjustment information Cji. This causes the electronic component 4 to be mounted at the actual printing position of the solder group 5.

When the non-adjustment signal is input with regard to a certain electronic component 4, on the other hand, the component mounting machine 22 mounts this electronic component 4 on the solder group 5, such that the center of the electronic component 4 is located at a position indicated by the ideal mounting position information of the electronic component 4. This causes the electronic component 4 to be mounted at the ideal printing position of the solder group 5.

When the "printing failure signal" is input from the arithmetic device 43, the component mounting machine 22 transfers the substrate 1 to a non-illustrated defective product hopper without mounting the electronic component 4 on the substrate 1.

Figure 6:
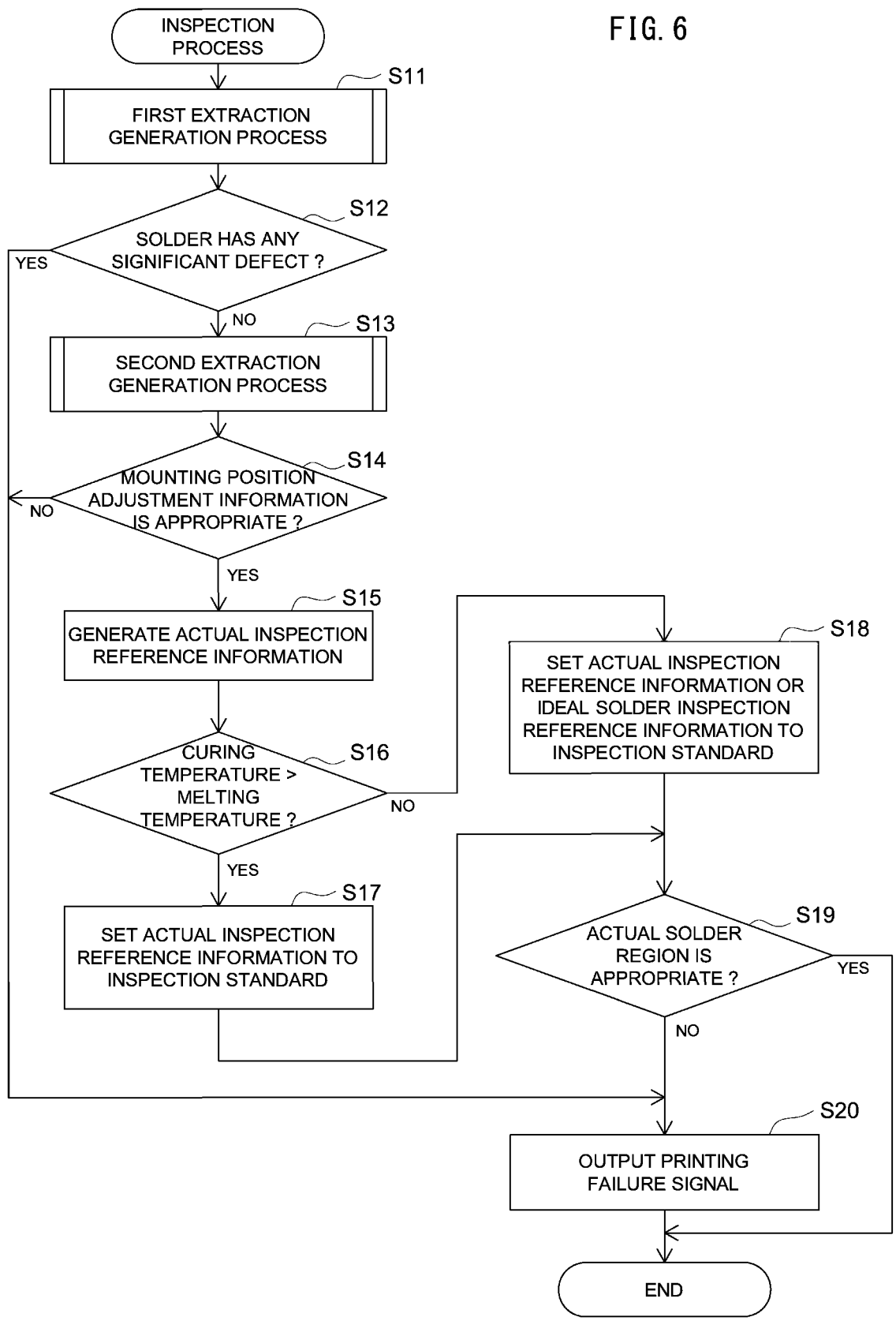
FIG. 6 is a flowchart showing an inspection process according to one or more embodiments.
Figure 8:
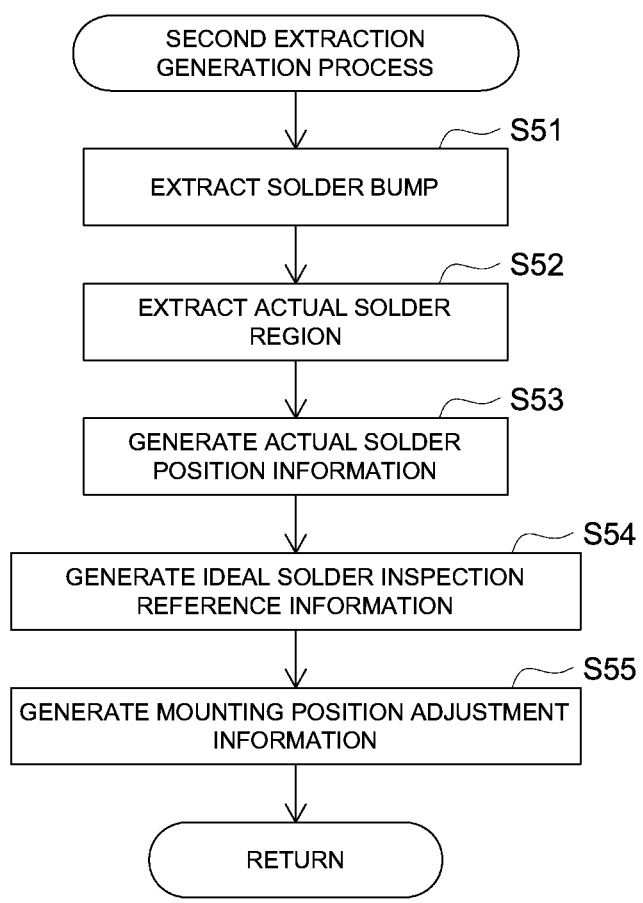
FIG. 8 is a flowchart showing a second extraction generation process according to one or more embodiments.

The following describes the inspection process performed by the solder printing inspection device 21 more in detail with reference to the flowcharts of FIGS. 6 and 8 and other drawings. In FIGS. 9 to 17, the inspection standard, for example, the solder search region and the actual inspection reference information Kjh (actual solder inspection window), is shown by the thick line.

Figure 9:
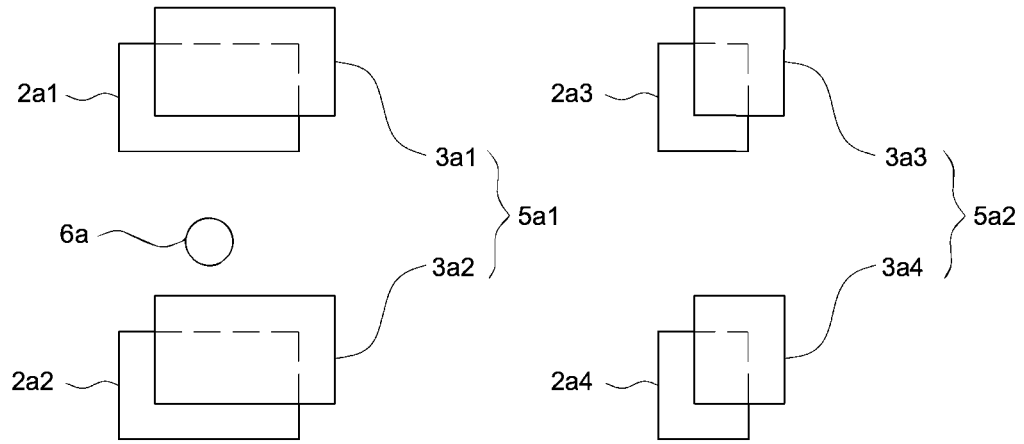
FIG. 9 is a schematic plan view illustrating the printing state of solders and the like used in the description of the inspection process according to one or more embodiments.
Figure 10:
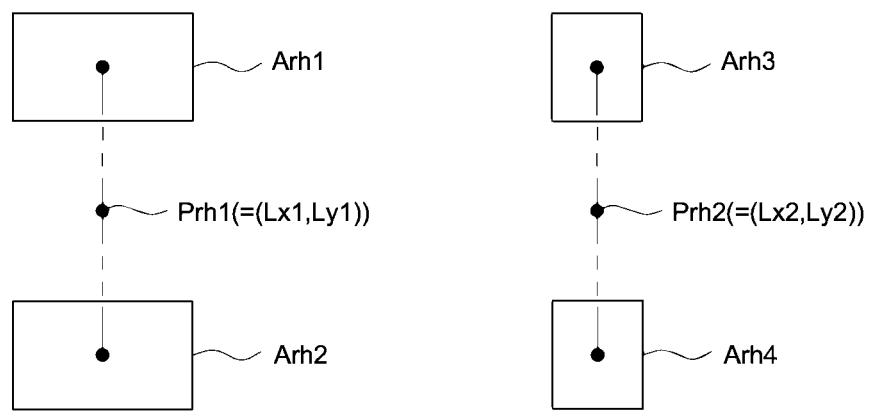
FIG. 10 is a schematic plan view illustrating ideal solder regions and ideal solder position information according to one or more embodiments.

For the purpose of illustration, the inspection process described below is related to a solder group 5a1 comprised of solders 3a1 and 3a2 that are printed on electrode patterns 2a1 and 2a2 and a solder group 5a2 comprised of solders 3a3 and 3a4 that are printed on electrode patterns 2a3 and 2a4 (respectively shown in FIG. 9). A similar inspection process is performed for the other solder groups 5.

The solders 3a1 and 3a2 have identical sizes, and the solders 3a3 and 3a4 have identical sizes. The solders 3a1 and 3a2 are larger in size than the solders 3a3 and 3a4. A relatively large electronic component 4 is mounted on the solders 3a1 and 3a2, whereas a relatively small electronic component 4 is mounted on the solders 3a3 and 3a4. The electronic component 4 mounted on the solders 3a1 and 3a2 is fixed by the adhesive 6, whereas the electronic component 4 mounted on the solders 3a3 and 3a4 is not fixed by the adhesive 6.

It is assumed that the solders 3a1, 3a2, 3a3 and 3a4 are printed to have deviations of "1 mm" in an X-axis direction and "1 mm" in a Y-axis direction from the corresponding electrode patterns 2a1, 2a2, 2a3 and 2a4. Furthermore, it is assumed that the solders 3a1, 3a2, 3a3 and 3a4 are printed to respectively have ideal sizes (dimensions). It is also assumed that the adhesive 6a is applied at an ideal position to have an ideal size. These numerical values are only illustrative.

The inspection process first performs a first extraction generation process at step S11 as shown in FIG. 6.

Figure 7:
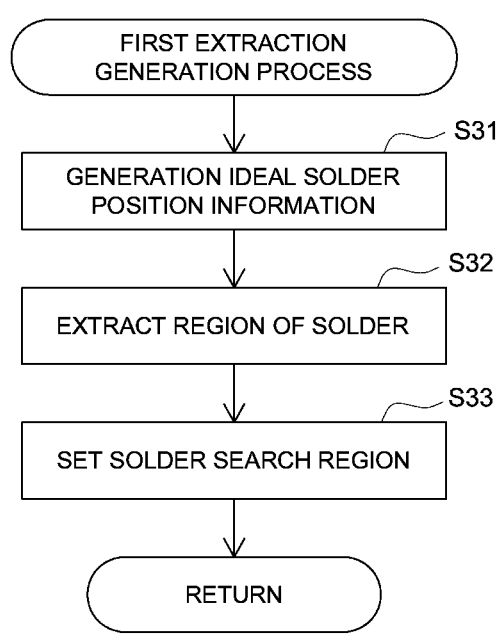
FIG. 7 is a flowchart showing a first extraction generation process according to one or more embodiments.

The first extraction generation process generates the ideal solder position information Prh, based on the design data or the like at step S31 as shown in FIG. 7. According to one or more embodiments, the first extraction generation process generates a midpoint (Lx1, Ly1) of center coordinates of an ideal solder region Arh1 with regard to the solder 3a1 on the design data or the manufacturing data and center coordinates of an ideal solder region Arh2 with regard to the solder 3a2 on the design data or the manufacturing data, as ideal solder position information Prh1. The first extraction generation process also generates a midpoint (Lx2, Ly2) of center coordinates of an ideal solder region Arh3 with regard to the solder 3a3 on the design data or the manufacturing data and center coordinates of an ideal solder region Arh4 with regard to the solder 3a4 on the design data or the manufacturing data, as ideal solder position information Prh2 (respectively shown in FIG. 10).

At step S32, the first extraction generation process subsequently extracts respective planar regions occupied by the respective solders 3a1, 3a2, 3a3 and 3a4 on the substrate 1, based on the image data taken by the CCD camera 33. Information regarding the extracted planar regions is stored in the storage device 42.

Figure 11:
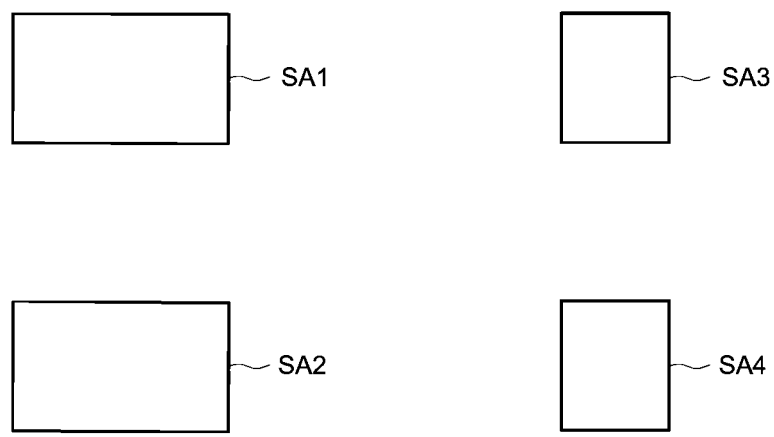
FIG. 11 is a schematic plan view illustrating solder search regions according to one or more embodiments.

At step S33, the first extraction generation process then sets solder search regions SA1, SA2, SA3 and SA4 that respectively have center coordinates identical with the center coordinates of the ideal solder regions Arh1, Arh2, Arh3 and Arh4 and that are slightly larger than the ideal solder regions Arh1, Arh2, Arh3 and Arh4 (as shown in FIG. 11).

Referring back to FIG. 6, the inspection process determines whether the printing quality of the solder 3 has any significant defect at step S12 subsequent to the first extraction generation process. More specifically, the inspection process determines whether a planar region of each of the solders 3a1, 3a2, 3a2 and 3a4 that are respectively present in the solder search regions SA1, SA2, SA3 and SA4 occupies a predetermined or greater ratio of the area of the solder search region SA1, SA2, SA3 or SA4. The inspection process also determines whether there are a plurality of planar regions of the solder 3 respectively having predetermined or larger areas (for example, 20% of the area of the solder search region SA1, SA2, SA3 or SA4) in the solder search region SA1, SA2, SA3 or SA4.

When the ratio of the planar region of each of the solders 3a1, 3a2, 3a3 and 3a4 to the area of the solder search region SA1, SA2, SA3 or SA4 is less than the predetermined ratio or when a plurality of planar regions of the solder 3a1, 3a2, 3a3 or 3a4 respectively having the predetermined or larger areas are present in the solder search region SA1, SA2, SA3 or SA4 (step S12: YES), the inspection process proceeds to step S20. The inspection process outputs the "printing failure signal" to the component mounting machine 22 at step S20 and is then terminated.

When the planar region of each of the solders 3a1, 3a2, 3a3 and 3a4 occupies the predetermined or greater ratio of the area of the solder search region SA1, SA2, SA3 or SA4 and a plurality of planar regions of the solder 3a1, 3a2, 3a3 or 3a4 respectively having the predetermined or larger areas are not present in the solder search region SA1, SA2, SA3 or SA4 (step S12: NO), on the other hand, the inspection process proceeds to a second extraction generation process of step S13.

Figure 12:
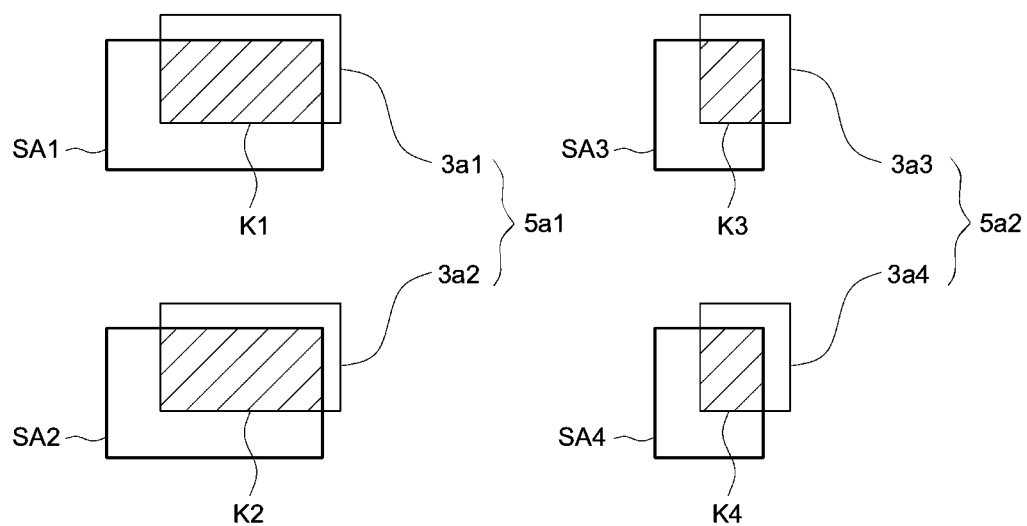
FIG. 12 is a schematic plan view illustrating solder bumps and the like according to one or more embodiments.

The following describes the second extraction generation process of step S13. As shown in FIG. 8, at step S51, the second extraction generation process first extracts the solders 3a1, 3a2, 3a3 and 3a4 that are respectively present in the solder search regions SA1, SA2, SA3 and SA4, as solder bumps K1, K2, K3 and K4 (areas shown by slant lines in FIG. 12) (as shown in FIG. 12).

Figure 13:
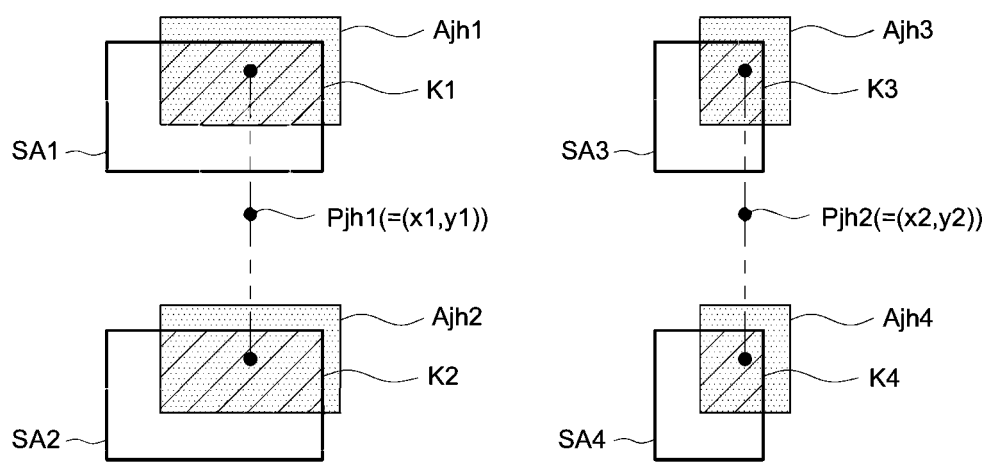
FIG. 13 is a schematic plan view illustrating actual solder regions, actual solder position information, and the like according to one or more embodiments.

At step S52 subsequent to step S51, the second extraction generation process extracts the actual solder regions Ajh. More specifically, the second extraction generation process extracts solder regions inked with the extracted solder bumps K1, K2, K3 and K4, as actual solder regions Ajh1, Ajh2, Ajh3 and Ajh4 (areas shown by the dotted pattern in FIG. 13) (as shown in FIG. 13).

At step S53, the second extraction generation process subsequently generates the actual solder position information Pjh. According to one or more embodiments, the second extraction generation process generates a midpoint (x1, y1) of center of gravity coordinates of the actual solder region Ajh1 and center of gravity coordinates of the actual solder region Ajh2, as actual solder position information Pjh1. The second extraction generation process also generates a midpoint (x2, y2) of center of gravity coordinates of the actual solder region Ajh3 and center of gravity coordinates of the actual solder region Ajh4, as actual solder position information Pjh2 (respectively shown in FIG. 13).

Figure 14:
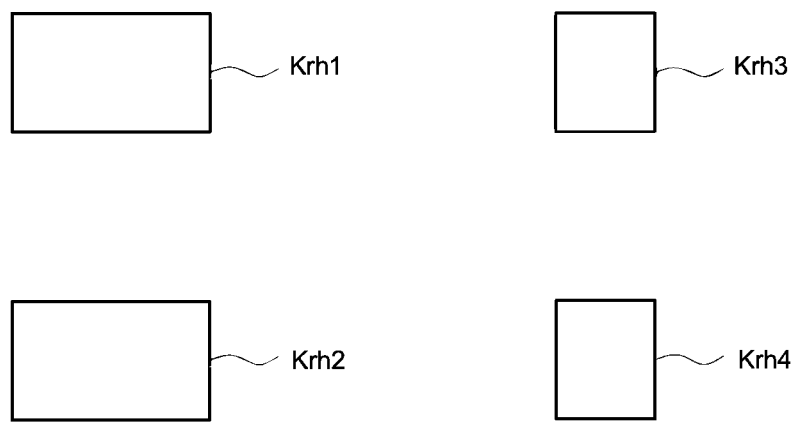
FIG. 14 is a schematic plan view illustrating ideal solder inspection reference information according to one or more embodiments.
Figure 15:
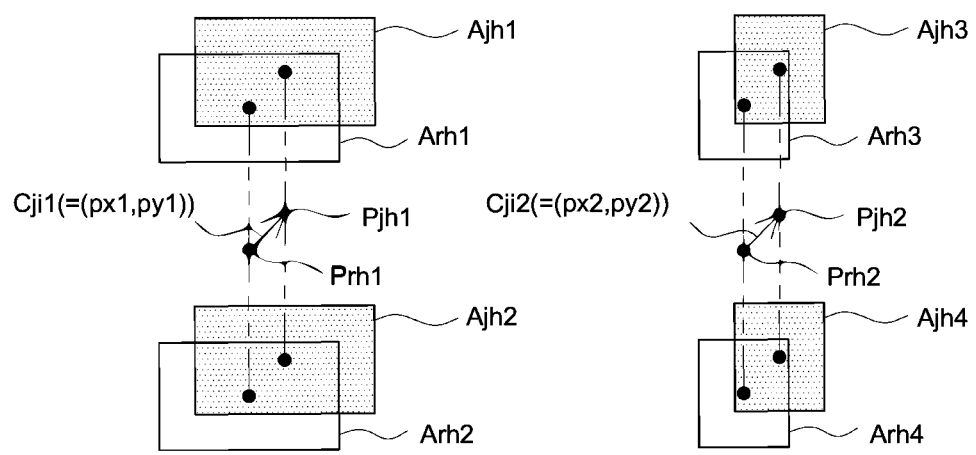
FIG. 15 is a schematic plan view illustrating mounting position adjustment information and the like according to one or more embodiments.
Figure 16:
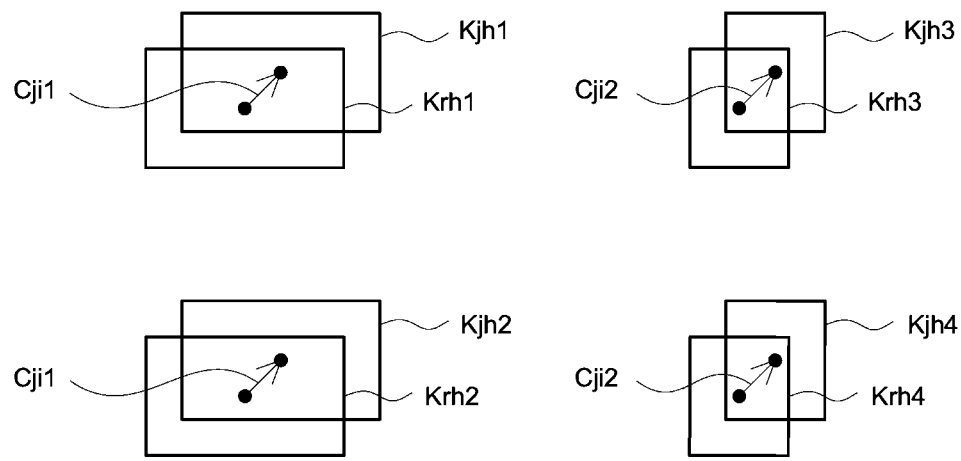
FIG. 16 is a schematic plan view illustrating actual inspection reference information according to one or more embodiments.

At subsequent step S54, the second extraction generation process generates the ideal solder inspection reference information Krh (ideal solder inspection windows). According to one or more embodiments, the second extraction generation process generates ideal solder inspection windows that respectively have shapes similar to the shapes of the ideal solder regions Arh1, Arh2, Arh3, and Arh4, that are slightly larger than the ideal solder regions Arh1, Arh2, Arh3 and Arh4, and that respectively have center coordinates, which are identical with respective center of gravity coordinates of the ideal solder regions Arh1, Arh2, Arh3 and Arh4, as ideal solder inspection reference information Krh1, Krh2, Krh3 and Krh4 (as shown in FIG. 14).

At step S55, the second extraction generation process subsequently generates the mounting position adjustment information Cji. More specifically, the second extraction generation process generates vector information [=(Px1, Py1)] based on the actual solder position information Pjh1 [=(x1, y1)] generated at step S53 and the ideal solder position information Prh1 [=(Lx1, Ly1)] generated at step S31, as mounting position adjustment information Cji1. The second extraction generation process also generates vector information [=(Px2, Py2)] based on the actual solder position information Pjh2 [=(x2, y2)] and the ideal solder position information Prh2 [=(Lx2, Ly2)], as mounting position adjustment information Cji2 (respectively shown in FIG. 15).

Referring back to FIG. 6, the inspection process determines whether the generated mounting position adjustment information Cji1 and Cji2 are appropriate at step S14 subsequent to the second extraction generation process. For example, the inspection process checks the size or the like of the mounting position adjustment information Cji1 and Cji2. When either piece of the mounting position adjustment information Cji1 and Cji2 is inappropriate (step S14: NO), the inspection process outputs the "printing failure signal" at step S20 and is then terminated.

When both pieces of the mounting position adjustment information Cji1 and Cji2 are appropriate (step S14: YES), on the other hand, the inspection process proceeds to step S15 to generate the actual inspection reference information Kjh. According to one or more embodiments, the inspection process generates actual solder inspection windows obtained by shifting the respective pieces of ideal solder inspection reference information Krh1 and Krh2 (ideal solder inspection windows) by the mounting position adjustment information Cji1, as actual inspection reference information Kjh1 and Kjh2. Additionally, the inspection process generates actual solder inspection windows obtained by shifting the respective pieces of ideal solder inspection reference information Krh3 and Krh4 (ideal solder inspection windows) by the mounting position adjustment information Cji2, as actual inspection reference information Kjh3 and Kjh4 (respectively shown in FIG. 16).

At step S16, the inspection process subsequently determines whether the curing temperature of the adhesive 6 is higher than the melting temperature of the solder 3, based on the information obtained by the information obtaining unit 48.

When the curing temperature of the adhesive 6 is higher than the melting temperature of the solder 3 (step S16: YES), the inspection process proceeds to step S17 to set the actual inspection reference information Kjh to the inspection standard of the solder group 5. According to one or more embodiments, the inspection process sets the actual inspection reference information Kjh1 and Kjh2 to the inspection standard of the solder group 5a1 and sets the actual inspection reference information Kjh3 and Kjh4 to the inspection standard of the solder group 5a2.

When the curing temperature of the adhesive 6 is lower than the melting temperature of the solder 3 (step S16: NO), on the other hand, the inspection process proceeds to step S18 to set the ideal solder inspection reference information Krh to the inspection standard of the solder group 5 corresponding to the electronic component 4 that is to be fixed by the adhesive 6 and to set the actual inspection reference information Kjh to the inspection standard of the solder group 5 corresponding to the electronic component 4 that is not to be fixed by the adhesive 6. According to one or more embodiments, the respective pieces of the ideal solder inspection reference information Krh1 and Krh2 are set to the inspection standard of the solder group 5a1, and the respective pieces of the actual inspection reference information Kjh3 and Kjh4 are set to the inspection standard of the solder group 5a2. According to one or more embodiments, a negative answer is given at step S16 when the curing temperature of the adhesive 6 is equal to the melting temperature of the solder 3. According to a modification, an affirmative answer may be given at step S16 when the curing temperature of the adhesive 6 is equal to the melting temperature of the solder 3.

At step S19 subsequent to either step S17 or step S18, the inspection process uses the inspection standard that is either the actual inspection reference information Kjh or the ideal solder inspection reference information Krh to determine whether the actual solder regions Ajh are appropriate.

Figure 17:
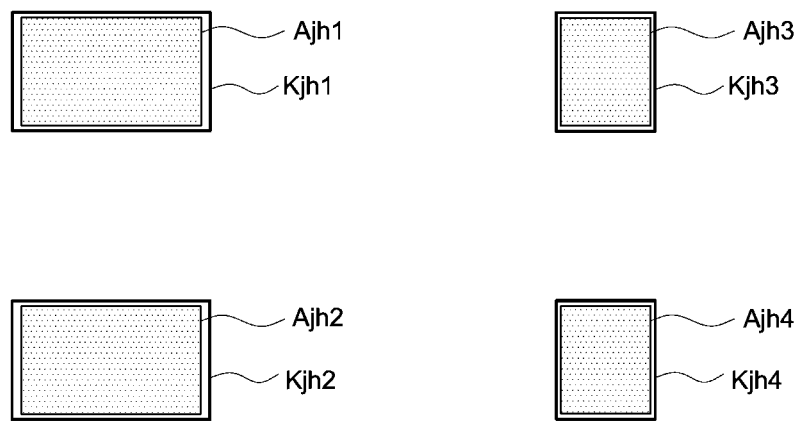
FIG. 17 is a schematic plan view illustrating inspection of solders using the actual inspection reference information when the curing temperature of an adhesive is higher than the melting temperature of the solders according to one or more embodiments.

According to one or more embodiments, when the curing temperature of the adhesive 6 is higher than the melting temperature of the solder 3, the inspection process determines whether the ratio of a range occupied by a region other than the actual solder region Ajh1, Ajh2, Ajh3 or Ajh4 to a corresponding piece of the actual inspection reference information Kjh1, Kjh2, Kjh3 or Kjh4 (actual solder inspection window) exceeds a reference value set in advance (as shown in FIG. 17).

When the ratio of the range occupied by the region other than the actual solder region Ajh1, Ajh2, Ajh3 or Ajh4 to the corresponding piece of the actual inspection reference information Kjh1, Kjh2, Kjh3 or Kjh4 is equal to or less than the above reference value (step S19: YES), the inspection process determines the printing qualities of the solder groups 5a1 and 5a2 as "good printing quality" and is then terminated.

When at least one of the actual solder regions Ajh1, Ajh2, Ajh3 and Ajh4 does not satisfy the condition of the determination described above (step S19: NO), on the contrary, the inspection process outputs the "printing failure signal" to the component mounting machine 22 at step S20 and is then terminated.

Figure 18:
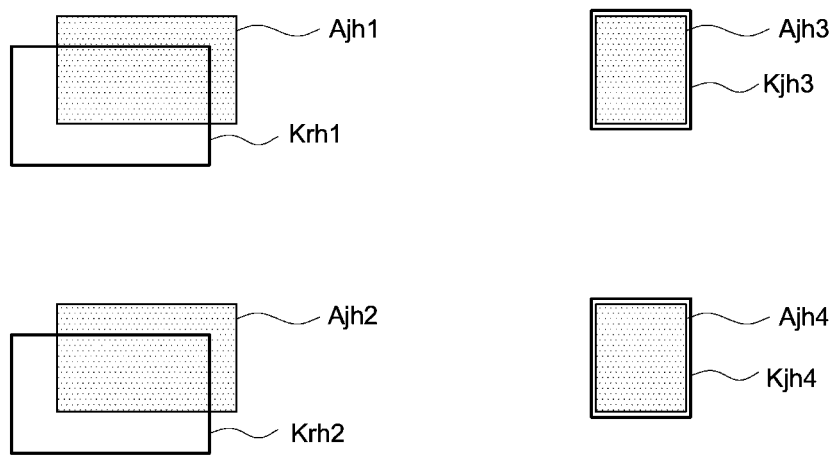
FIG. 18 is a schematic plan view illustrating inspection of solders using the actual inspection reference information or the ideal solder inspection reference information when the curing temperature of the adhesive is lower than the melting temperature of the solders according to one or more embodiments.

When the curing temperature of the adhesive 6 is lower than the melting temperature of the solder 3, the inspection process determines whether the ratio of a range occupied by a region other than the actual solder region Ajh1 or Ajh2 to a corresponding piece of the ideal solder inspection reference information Krh1 or Krh2 (ideal solder inspection window) exceeds a reference value set in advance, and also determines whether the ratio of a range occupied by a region other than the actual solder region Ajh3 or Ajh4 to a corresponding piece of the actual inspection reference information Kjh3 or Kjh4 (actual solder inspection window) exceeds a reference value set in advance (as shown in FIG. 18).

When the ratio of the range occupied by the region other than the actual solder region Ajh1 or Ajh2 to the corresponding piece of the ideal solder inspection reference information Krh1 or Krh2 is equal to or less than the above reference value and the ratio of the range occupied by the region other than the actual solder region Ajh3 or Ajh4 to the corresponding piece of the actual inspection reference information Kjh3 or Kjh4 is equal to or less than the above reference value (step S19: YES), the inspection process determines the printing qualities of the solder groups 5a1 and 5a2 as "good printing quality" and is then terminated.

When at least one of the actual solder regions Ajh1, Ajh2, Ajh3 and Ajh4 does not satisfy the condition of the determination described above (step S19: NO), on the contrary, the inspection process outputs the "printing failure signal" to the component mounting machine 22 at step S20 and is then terminated.

The series of the inspection process described above is subsequently performed for the solder groups 5 other than the solder groups 5a1 and 5a2. When the printing qualities of all the solder groups 5 are determined as "good printing qualities", the substrate 1 is determined as a "non-defective product".

On the above basis, when the curing temperature of the adhesive 6 is higher than the melting temperature of the solder 3, the control device 41 (more specifically, the mounting position adjustment information output unit 49) outputs multiple pieces of the mounting position adjustment information Cji set for the respective solder groups 5, to the component mounting machine 22. When the curing temperature of the adhesive 6 is lower than the melting temperature of the solder 3, on the other hand, the control device 41 (more specifically, the mounting position adjustment information output unit 49) outputs the non-adjustment signal for the electronic component 4 that is to be fixed by the adhesive 6 and outputs the mounting position adjustment information Cji for the electronic component 4 that is not to be fixed by the adhesive 6, to the component mounting machine 22.

In response to input of the mounting position adjustment information Cji or the non-adjustment signal, the component mounting machine 22 mounts the electronic component 4 at a position determined by shifting the ideal mounting position information by the mounting position adjustment information Cji or at a position indicated by the ideal mounting position information.

When the printing quality of any of the solder groups 5 is determined as "poor printing quality", on the other hand, the substrate 1 is determined as a "defective product". In this case, neither the mounting position adjustment information Cji nor the non-adjustment signal is output to the component mounting machine 22. No electronic component 4 is accordingly mounted on the substrate 1.

The substrate 1 with the electronic components 4 mounted thereon by the component mounting machine 22 is led to the reflow device 15 as described above.

Figure 19:
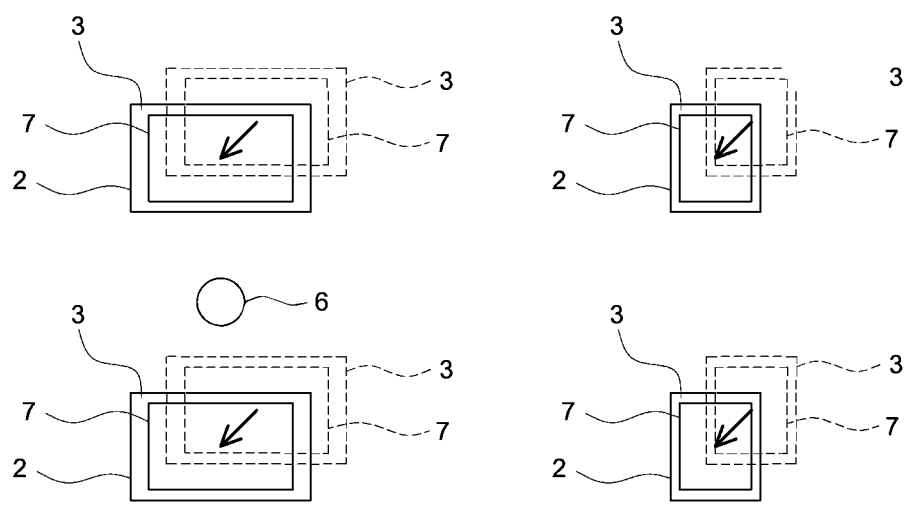
FIG. 19 is a schematic plan view illustrating placement of solders and the like at appropriate positions by exertion of self-alignment effect according to one or more embodiments.

When the curing temperature of the adhesive 6 is higher than the melting temperature of the solder 3, the self-alignment effect is exerted in a reflow process. As shown in FIG. 19, this causes the solder 3 to be placed on the electrode pattern 2 and thereby causes the electrode portion 7 to be placed at an appropriate position. As a result, the electronic component 4 is placed at an appropriate position (not shown in FIG. 19 or FIG. 20).

Figure 20:
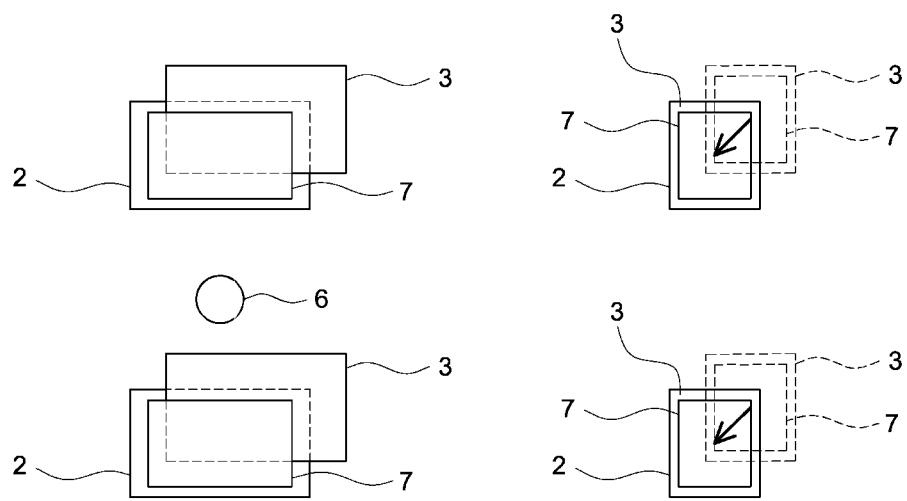
FIG. 20 is a schematic plan view illustrating the case where the solders and the like are moved by exertion of the self-alignment effect and the case where the solders and the like are not moved by non-exertion of the self-alignment effect due to the influence of the adhesive according to one or more embodiments.

When the curing temperature of the adhesive 6 is lower than the melting temperature of the solder 3, on the other hand, the self-alignment effect is not exerted or is unlikely to be exerted in the reflow process for the electronic component 4 that is to be fixed by the adhesive 6 or for the solder group 5 corresponding to this electronic component 4. Accordingly, as shown in FIG. 20, the solder 3 corresponding to the electronic component 4 that is to be fixed by the adhesive 6 is hardly moved, whereas the solder 3 corresponding to the electronic component 4 that is not to be fixed by the adhesive 6 is moved. As a result, the electronic component 4 that is mounted at the position indicated by the ideal mounting position information and that is to be fixed by the adhesive 6 is kept at the appropriate position even after the reflow process. The electronic component 4 that is mounted at the position determined by shifting the ideal mounting position information by the mounting position adjustment information and that is not to be fixed by the adhesive 6 is, on the other hand, placed at an appropriate position accompanied with the move of the solder 3.

As described above in detail, according to one or more embodiments, when the curing temperature of the adhesive 6, which is used to fix an electronic component 4 corresponding to a solder group 5 that is an inspection object, obtained by the information obtaining unit 48 is higher than the melting temperature of solders 3 included in the solder group 5, inspection of each of the solders 3 included in the solder group 5 is performed on the basis of the actual inspection reference information Kjh that is obtained by shifting the ideal solder inspection reference information Krh by the mounting position adjustment information Cji. In other words, under the condition that the self-alignment effect is exerted, a reference position of inspection is changed in the unit of each electronic component 4 (in the unit of each solder group 5), based on the positions of the solders 3 actually printed, and inspection of each of the solders 3 is performed based on this changed reference position. This configuration accordingly enables the printing quality of the solders 3 to be appropriately inspected by taking into account exertion of the self-alignment effect.

When the curing temperature of the adhesive 6, which is used to fix the electronic component 4 corresponding to the solder group 5 that is the inspection object, obtained by the information obtaining unit 48 is lower than the melting temperature of the solders 3 included in the solder group 5, on the other hand, inspection of each of the solders 3 included in the solder group 5 is performed on the basis of the ideal solder inspection reference information Krh. In other words, under the condition that the self-alignment effect is not exerted or is unlikely to be exerted, inspection of each of the solders 3 is performed based on the positions and the regions of the respective solders 3 on design data or on manufacturing data (ideal positions and ideal regions of respective solders 3 on an eventually produced substrate 1). This configuration accordingly enables the printing quality of the solders 3 to be appropriately inspected by taking into account non-exertion or improbable exertion of the self-alignment effect.

As described above, the configuration of one or more embodiments enables the printing quality of the solders 3 to be appropriately inspected both in the case where the self-alignment effect is exerted and in the case where the self-alignment effect is not exerted (or is unlikely to be exerted). As a result, this configuration prevents the electronic components 4 from being mounted on the substrate 1 where the solders 3 are not appropriately printed, thus enhancing the yield and suppressing an increase in the manufacturing cost.

Furthermore, when the curing temperature of the adhesive 6 is higher than the melting temperature of the solder 3, the mounting position adjustment information Cji is output to the component mounting machine 22. This configuration enables the electronic component 4 to be placed at a position determined by taking into account the self-alignment effect and more reliably mounts the electronic component 4 at an appropriate position. This configuration utilizes the information that is generated in the inspection process, for the mounting process. There is accordingly no need to perform a series of processing, which is similar to that performed in the inspection process, in a duplicated manner in the mounting process. This improves the manufacturing efficiency.

When the curing temperature of the adhesive 6 is lower than the melting temperature of the solder 3, on the contrary, the electronic component 4 that is to be fixed by the adhesive 6 is mounted at a position indicated by the ideal mounting position information. Accordingly, this configuration enables the electronic component 4 to be placed at an appropriate position from the beginning by taking into account that the self-alignment effect is not exerted or is unlikely to be exerted and that the electronic component 4 is hardly moved.

Additionally, when the electronic component 4 is not to be fixed by the adhesive 6, the mounting position adjustment information Cji is output to the component mounting machine 22 as the information relating to the mounting position of the electronic component 4, irrespective of the curing temperature of the adhesive 6. In other words, the mounting position adjustment information Cji is output with regard to the electronic component 4 that is movable by the self-alignment effect. This configuration accordingly enables the electronic component 4 to be placed at a position determined by taking into account the self-alignment effect and more reliably mounts the electronic component 4 at an appropriate position.

The present invention is not limited to the above embodiments but may be implemented, for example, by configurations described below. The present invention may also be naturally implemented by applications and modifications other than those illustrated below.

(a) According to the embodiments described above, one piece of coordinate information is generated with respect to each of the solder groups 5, as the ideal solder position information Prh and as the actual solder position information Pjh. According to a modification, coordinate information may be generated with respect to each of the solders 3 included in each solder group 5, as the ideal solder position information Prh and as the actual solder position information Pjh. For example, center of gravity coordinates of each of the solders 3 on the data may be generated as the ideal solder position information Prh, and center of gravity coordinates of each of the solders 3 actually printed may be generated as the actual solder position information Pjh. The type of the ideal solder position information needs to be identical with the type of the actual solder position information.

When multiple pieces of coordinate information are generated as the ideal solder position information Prh and as the actual solder position information Pjh like the above modification, the ideal solder inspection reference information Krh, the mounting position adjustment information Cji and the actual inspection reference information Kjh may also be modified appropriately. For example, coordinates identical with the center of gravity coordinates of the ideal solder region Arh may be generated as the ideal solder inspection reference information Krh. For example, vector information $[=(Q_x, Q_y)]$ may be generated with regard to each of the solder groups 5, as the mounting position adjustment information Cji. This vector information may be comprised of, for example, an average value $(Q_x)$ of an amount of positional misalignment $\Delta x$ along the X-axis direction and an average value $(Q_y)$ of an amount of positional misalignment $\Delta y$ along the Y-axis direction of the actual solder position information Pjh relative to the ideal solder position information Prh. Additionally, coordinates obtained by shifting the ideal solder inspection reference information Krh (coordinate information) by the vector information may be generated as the actual inspection reference information Kjh.

A modified procedure of inspection of the printing quality of the solder group 5 may inspect the good/poor printing quality of the solder group 5 by determining whether respective absolute values of amounts of positional misalignment along the X-axis direction and along the Y-axis direction of the actual solder position information Pjh relative to the actual inspection reference information Kjh or relative to the ideal solder inspection reference information Krh are within predetermined reference values that are set in advance. More specifically, when the respective amounts of positional misalignment are equal to or less than the respective reference values with regard to the respective solders 3 included in the solder group 5, the printing quality of the solder group 5 may be determined as "good printing quality". When at least one of the respective amounts of positional misalignment is greater than the corresponding reference value with regard to at least one of the solders 3 included in the solder group 5, the printing quality of the solder group 5 may be determined as "poor printing quality".

(b) According to the embodiments described above, the inspection process is performed for all the solder groups 5. According to a modification, the inspection process may be performed only for a predetermined solder group 5 selected by an operator or the like. This simplifies the inspection process and improves the manufacturing efficiency. In this modification, an average of the mounting position adjustment information Cji with regard to a solder group 5 as an inspection object may be used as the mounting position adjustment information Cji with regard to solder groups 5 other than the solder group 5 as the inspection object.

(c) According to the embodiments described above, the vector information is generated as the mounting position adjustment information Cji. For example, when the curing temperature of the adhesive 6 is higher than the melting temperature of the solder 3, the electronic component 4 is mounted at the position determined by shifting the ideal mounting position information by this vector information. In other words, the electronic component 4 is mounted at the position determined by shifting the ideal mounting position information in the X-axis direction and in the Y-axis direction. According to a modification, rotation angle information may be generated as the mounting position adjustment information Cji. For example, a range of coordinates indicating the ideal solder region Arh may be set to the ideal solder position information Prh, and a range of coordinates indicating the actual solder region Ajh may be set to the actual solder position information Pjh. An amount of rotation and a direction of rotation of the actual solder position information Pjh about the center of the electronic component 4 on the data as a rotational center relative to the ideal solder position information Prh may be generated as the mounting position adjustment information Cji. The mounting position of the electronic component 4 may be adjusted, based on the amount of rotation and the direction of rotation. According to another modification, the mounting position adjustment information Cji may include both the vector information and the information regarding the amount of rotation and the direction of rotation.

(d) The above embodiments determine the good/poor printing quality of each solder group 5 by determining whether the ratio of the range occupied by the region other than the actual solder region Ajh to the actual inspection reference information Kjh (actual solder inspection window) or to the ideal solder inspection reference information Krh (ideal solder inspection window) exceeds the predetermined reference value. A modification may determine the good/poor printing quality of each solder group 5 by determining whether an amount of positional misalignment of the center of gravity coordinates of the actual solder region Ajh relative to the center coordinates of the actual inspection reference information Kjh (actual solder inspection window) or the ideal solder inspection reference information Krh (ideal solder inspection window) exceeds a predetermined reference value. Another modification may determine the good/poor printing quality of each solder group 5, based on a matching ratio of the actual solder region Ajh relative to the actual inspection reference information Kjh (actual solder inspection window) or relative to the ideal solder inspection reference information Krh (ideal solder inspection window).

(e) At the time when the "printing failure signal" is output, the inspection process performed by the solder printing inspection device 21 may be skipped with regard to uninspected solder groups 5 and may be terminated, although this is not specifically described in the above embodiments. This modification suppresses continuation of the inspection process with respect to the substrate 1 that is a defective product and thereby improves the inspection efficiency.

(f) According to the embodiments described above, the ideal solder inspection reference information Krh and the actual inspection reference information Kjh are set to be larger than the ideal solder region Arh. According to a modification, the ideal solder inspection reference information Krh and the actual inspection reference information Kjh may be set to have identical sizes with the size of the ideal solder region Arh.

(g) The above embodiments generate the ideal solder region Arh and subsequently generate the ideal solder position information Prh from the ideal solder region Arh. A modification may generate the ideal solder position information Prh directly from the design data or from the manufacturing data without generating the ideal solder region Arh.

(h) The above embodiments generate the ideal solder inspection reference information Krh, based on the ideal solder region Arh. A modification may store in advance information with regard to an inspection reference position and an inspection reference range in the form of design data or in the form of manufacturing data in the storage device 42 and may generate the ideal solder inspection reference information Krh, based on the stored information.

(i) When the "printing failure signal" is output in the process of inspection of a plurality of solder groups 5, there is a possibility that a metal screen is placed at a position deviated from the substrate 1, although this is not specifically described in the above embodiments. With a view to correcting such a positional misalignment of the metal screen, a modification may adjust the solder printing position by the manufacturing system 11 (i.e., may move the metal screen), based on the mounting position adjustment information generated with regard to respective solder groups 5.

(j) According to the embodiments described above, the information obtaining unit 48 is configured to receive the input of the information with regard to the curing temperature of the adhesive 6 via the input device 50 and thereby obtain the information with regard to the curing temperature of the adhesive 6. According to a modification, the information with regard to the curing temperature of the adhesive 6 may be included in manufacturing data or in design data. The information obtaining unit 48 may be configured to obtain the information with regard to the curing temperature of the adhesive 6 from the manufacturing data or the like. For example, CAD data that is design data of the substrate 1 may be configured to include the information with regard to the curing temperature of the adhesive 6.

According to another modification, information with regard to the curing temperatures of multiple different types of the adhesives 6 may be stored in advance in the storage device 42, and the arithmetic device 43 may be configured to receive the input of information with regard to the type of the adhesive 6 from the input device 50. In this modification, the information obtaining unit 48 may be configured to obtain the information with regard to the curing temperature of the adhesive 6 from the storage device 42, based on the input information with regard to the type of the adhesive 6.

(k) According to the embodiments described above, the identical type of the solders 3 and the identical type of the adhesives 6 are provided on the substrate 1. According to a modification, different types of the solders 3 and different types of the adhesives 6 may be provided on the substrate 1.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

REFERENCE SIGNS LIST

1 . . . printed circuit board (substrate), 3 . . . solder paste (solder), 4 . . . electronic component, 5 . . . solder group, 6 . . . adhesive, 12 . . . solder printing device (solder printing machine), 14 . . . component mounting system, 21 . . . solder printing inspection device, 22 . . . component mounting machine, 32 . . . illumination device (irradiation unit or irradiator), 33 . . . CCD camera (imaging unit or imaging device), 44 . . . ideal solder inspection reference information generating unit, 45 . . . image processing unit (actual solder position information generating unit), 48 . . . information obtaining unit (adhesive information obtaining unit), 49 . . . mounting position adjustment information output unit, Cji . . . mounting position adjustment information, Kjh . . . actual inspection reference information, Krh . . . ideal solder inspection reference information, Pjh . . . actual solder position information, Prh . . . ideal solder position information

The invention claimed is:

1. A solder printing inspection device that is placed on an upstream side of a component mounting machine that mounts an electronic component on solder that is printed on a substrate by a solder printing machine, and that inspects the solder on the substrate on which a thermosetting adhesive is applied, the solder printing inspection device comprising:
   an irradiator that irradiates the solder with light;
   an imaging device that takes an image of the irradiated solder; and
   a processor that:
      generates actual solder position information of a solder group that the electronic component is mounted on based on the image, wherein the solder group includes two or more solders;
      generates, based on design data or manufacturing data, ideal solder inspection reference information indicating a reference inspection position and/or a reference inspection range of the solder included in the solder group;
      outputs mounting position adjustment information to the component mounting machine, wherein
         the mounting position adjustment information indicates an amount of positional misalignment and a direction of positional misalignment of an expected mounting position information,
         the expected mounting position information indicates an expected mounting position of the electronic component relative to an ideal mounting position information,
         the ideal mounting position information indicates an ideal mounting position of the electronic component, and
         the mounting position adjustment information is based on an amount of positional misalignment and a direction of positional misalignment of the actual solder position information relative to an ideal solder position information, and
         the ideal soldering position is based on a position of the solder group included in the design data or the manufacturing data; and
      obtains a curing temperature of the adhesive, wherein the solder group is a predetermined inspection object;
   when the curing temperature of the adhesive is higher than a melting temperature of each of the solders included in the solder group, the adhesive fixing the electric component on the solder group, the processor:
      inspects each of the solders included in the solder group based on actual inspection reference information obtained by shifting the ideal solder inspection reference information by the mounting position adjustment information of the solder group, and
      outputs the mounting position adjustment information to the component mounting machine, and
   when the curing temperature of the adhesive is lower than the melting temperature of each of the solders included in the solder group, the adhesive fixing the electric component on the solder group, the processor inspects each of the solders included in the solder group based on the ideal solder inspection reference information of the solder group.

2. A solder printing inspection device that is placed on an upstream side of a component mounting machine that mounts an electronic component on solder that is printed on a substrate by a solder printing machine, and that inspects the solder on the substrate on which a thermosetting adhesive is applied, the solder printing inspection device comprising:
   an irradiator that irradiates the solder with light;
   an imaging device that takes an image of the irradiated solder; and
   a processor that:
      generates actual solder position information of a solder group that the electronic component is mounted on based on the image, wherein the solder group includes two or more solders;
      generates, based on design data or manufacturing data, ideal solder inspection reference information indicating a reference inspection position and/or a reference inspection range of the solder included in the solder group;
      outputs mounting position adjustment information to the component mounting machine, wherein
         the mounting position adjustment information indicates an amount of positional misalignment and a direction of positional misalignment of an expected mounting position information,
         the expected mounting position information indicates an expected mounting position of the electronic component relative to an ideal mounting position information,
         the ideal mounting position information indicates an ideal mounting position of the electronic component, and
         the mounting position adjustment information is based on an amount of positional misalignment and a direction of positional misalignment of the actual solder position information relative to an ideal solder position information, and
         the ideal soldering position is based on a position of the solder group included in the design data or the manufacturing data; and obtains a curing temperature of the adhesive, wherein the solder group is a predetermined inspection object;

when the curing temperature of the adhesive is higher than a melting temperature of each of the solders included in the solder group, the adhesive fixing the electric component on the solder group, the processor:
  inspects each of the solders included in the solder group based on actual inspection reference information obtained by shifting the ideal solder inspection reference information by the mounting position adjustment information of the solder group and
  outputs the mounting position adjustment information to the component mounting machine.

3. A solder printing inspection device that is placed on an upstream side of a component mounting machine that mounts an electronic component on solder that is printed on a substrate by a solder printing machine, and that inspects the solder on the substrate on which a thermosetting adhesive is applied, the solder printing inspection device comprising:
  an irradiator that irradiates the solder with light;
  an imaging device that takes an image of the irradiated solder; and
  a processor that:
    generates actual solder position information of a solder group that the electronic component is mounted on based on the image, wherein the solder group includes two or more solders;
    generates, based on design data or manufacturing data, ideal solder inspection reference information indicating a reference inspection position and/or a reference inspection range of the solder included in the solder group;
    outputs mounting position adjustment information to the component mounting machine, wherein
      the mounting position adjustment information indicates an amount of positional misalignment and a direction of positional misalignment of an expected mounting position information,
      the expected mounting position information indicates an expected mounting position of the electronic component relative to an ideal mounting position information,
      the ideal mounting position information indicates an ideal mounting position of the electronic component, and
      the mounting position adjustment information is based on an amount of positional misalignment and a direction of positional misalignment of the actual solder position information relative to an ideal solder position information, and
      the ideal solder position is based on a position of the solder group included in the design data or the manufacturing data; and
    obtains a curing temperature of the adhesive, wherein the solder group is a predetermined inspection object;
    when the curing temperature of the adhesive is lower than a melting temperature of each of the solders included in the solder group, the adhesive fixing the electric component on the solder group, the processor inspects each of the solders included in the solder group based on the ideal solder inspection reference information of the solder group.

4. The solder printing inspection device according to claim 1, wherein
  when the electronic component is not meant to be fixed by the adhesive on the solder group, the processor outputs the mounting position adjustment information of the solder group to the component mounting machine.

5. A solder printing inspection method that inspects solder printed on a substrate, on which a thermosetting adhesive is applied in a stage prior to mounting an electronic component on the solder using a component mounting machine, the solder printing inspection method comprising:
  irradiating the solder with light;
  taking an image of the solder irradiated with the light;
  generating actual solder position information of a solder group that the electronic component is mounted on based on the image, wherein the solder group includes two or more solders;
  generating, based on design data or manufacturing data, ideal solder inspection reference information indicating a reference inspection position and/or a reference inspection range of the solder included in the solder group;
  outputting mounting position adjustment information to the component mounting machine, wherein
    the mounting position adjustment information indicates an amount of positional misalignment and a direction of positional misalignment of an expected mounting position information,
    the expected mounting position information indicates an expected mounting position of the electronic component relative to an ideal mounting position information,
    the ideal mounting position information indicates an ideal mounting position of the electronic component, and
    the mounting position adjustment information is based on an amount of positional misalignment and a direction of positional misalignment of the actual solder position information relative to an ideal solder position information, and
    the ideal soldering position is based on a position of the solder group included in the design data or the manufacturing data; and
  obtaining a curing temperature of the adhesive, wherein the solder group is a predetermined inspection object;
  when the curing temperature of the adhesive is higher than a melting temperature of each of the solders included in the solder group, the adhesive fixing the electric component on the solder group, the solder printing inspection method:
    inspects each of the solders included in the solder group based on actual inspection reference information obtained by shifting the ideal solder inspection reference information by the mounting position adjustment information of the solder group, and
    outputs the mounting position adjustment information to the component mounting machine.

6. A solder printing inspection method that inspects solder printed on a substrate on which a thermosetting adhesive is applied in a stage prior to mounting an electronic component on the solder printed on the substrate by using a component mounting machine, the solder printing inspection method comprising:
  irradiating the solder with light;
  taking an image of the irradiated solder;
  generating actual solder position information of a solder group that the electronic component is mounted on based on the image, wherein the solder group includes two or more solders;
  generating, based on design data or manufacturing data, ideal solder inspection reference information indicating a reference inspection position and/or a reference inspection range of the solder included in the solder group;

outputting mounting position adjustment information to the component mounting machine, wherein
- the mounting position adjustment information indicates an amount of positional misalignment and a direction of positional misalignment of an expected mounting position information,
- the expected mounting position information indicates an expected mounting position of the electronic component relative to an ideal mounting position information,
- the ideal mounting position information indicates an ideal mounting position of the electronic component, and
- the mounting position adjustment information is based on an amount of positional misalignment and a direction of positional misalignment of the actual solder position information relative to an ideal solder position information, and
- the ideal solder position is based on a position of the solder group included in the design data or the manufacturing data; and obtaining a curing temperature of the adhesive, wherein the solder group is a predetermined inspection object;

when the curing temperature of the adhesive is lower than a melting temperature of each of the solders included in the solder group, the adhesive fixing the electric component on the solder group, the solder printing inspection method inspects each of the solders included in the solder group based on the ideal solder inspection reference information of the solder group.

7. A method of manufacturing a substrate, comprising:
printing the solder on the substrate;
applying the thermosetting adhesive on the substrate;
inspecting the solder using the solder printing inspection method according to claim 5;
mounting the electronic component on the substrate after the inspecting of the solder;
heating and melting the solder; and
heating and curing the thermosetting adhesive.

8. The solder printing inspection device according to claim 2, wherein
when the electronic component is not meant to be fixed by the adhesive on the solder group that is the predetermined inspection object, the processor outputs the mounting position adjustment information of the solder group to the component mounting machine.

9. The solder printing inspection device according to claim 3, wherein
when the electronic component is not meant to be fixed by the adhesive on the solder group that is the predetermined inspection object, the processor outputs the mounting position adjustment information of the solder group to the component mounting machine.

10. A method of manufacturing a substrate, comprising:
printing the solder on the substrate;
applying the thermosetting adhesive on the substrate;
inspecting the solder using the solder printing inspection method according to claim 6;
mounting the electronic component on the substrate after the inspecting of the solder;
heating and melting the solder; and
heating and curing the thermosetting adhesive.

* * * * *